(12) United States Patent
Kawanabe et al.

(10) Patent No.: US 11,923,227 B2
(45) Date of Patent: Mar. 5, 2024

(54) ELECTROSTATIC CHUCK AND METHOD FOR MANUFACTURING SAME

(71) Applicant: KYOCERA Corporation, Kyoto (JP)

(72) Inventors: Yasunori Kawanabe, Kirishima (JP); Yoshihiro Okawa, Kirishima (JP)

(73) Assignee: KYOCERA CORPORATION, Kyoto (JP)

( * ) Notice: Subject to any disclaimer, the term of this patent is extended or adjusted under 35 U.S.C. 154(b) by 739 days.

(21) Appl. No.: 17/044,669

(22) PCT Filed: Apr. 24, 2019

(86) PCT No.: PCT/JP2019/017408
§ 371 (c)(1),
(2) Date: Oct. 1, 2020

(87) PCT Pub. No.: WO2019/208625
PCT Pub. Date: Oct. 31, 2019

(65) Prior Publication Data
US 2021/0104426 A1    Apr. 8, 2021

(30) Foreign Application Priority Data
Apr. 27, 2018  (JP) ................................. 2018-086937

(51) Int. Cl.
*H01L 21/683* (2006.01)
*H01L 21/67* (2006.01)

(52) U.S. Cl.
CPC .... *H01L 21/6833* (2013.01); *H01L 21/67103* (2013.01)

(58) Field of Classification Search
CPC .................................................. H01L 21/6833
See application file for complete search history.

(56) References Cited

U.S. PATENT DOCUMENTS

| | | | |
|---|---|---|---|
| 5,600,530 A | 2/1997 | Smith | |
| 5,645,921 A * | 7/1997 | Matsunaga | H01L 21/6833 428/209 |
| 6,507,006 B1 | 1/2003 | Hiramatsu et al. | |
| 10,923,382 B2 * | 2/2021 | Uefuji | H01L 21/67103 |
| 2019/0019715 A1 | 1/2019 | Uefuji et al. | |

FOREIGN PATENT DOCUMENTS

| | | |
|---|---|---|
| JP | H10-501925 A | 2/1998 |
| JP | 2000-277596 A | 10/2000 |
| JP | 2014-093467 A | 5/2014 |
| JP | 2017-168818 A | 9/2017 |
| WO | 01/063972 A1 | 8/2001 |

\* cited by examiner

*Primary Examiner* — Scott Bauer
(74) *Attorney, Agent, or Firm* — Procopio, Cory, Hargreaves & Savitch LLP

(57) ABSTRACT

An electrostatic chuck includes an insulating base body including a predetermined surface, and an electrode inside the base body, which is layer shaped along the predetermined surface. An upper surface of the electrode facing a side where the predetermined surface is located and the base body are in contact. A gap which is rendered a vacuum or filled with a gas is interposed between a side surface of the electrode and the base body.

14 Claims, 12 Drawing Sheets

ELECTROSTATIC CHUCK AND METHOD FOR MANUFACTURING SAME

TECHNICAL FIELD

The present disclosure relates to an electrostatic chuck and a method for manufacturing the same.

BACKGROUND ART

Known in the art is an electrostatic chuck used in a semiconductor manufacturing apparatus and the like (for example, Patent Literature 1 and 2). Such an electrostatic chuck, for example, has a flat plate-shaped base body made of a ceramic and a layered electrode buried in the base body. A wafer is laid on an upper surface (broadest surface of plate shape, major surface) of the base body. Further, by supplying voltage to the electrode, the base body is charged and the wafer is clamped.

In Patent Literature 1, the side surface of the electrode is formed in a pointed shape in a cross-section perpendicular to the upper surface of the base body. In Patent Literature 2, a heater plate for heating the wafer is laid over a lower surface of the base body. The heater plate has two resin layers and a resistance heating element arranged between the two resin layers. A gap is formed on the horizontal side of the resistance heating element.

CITATION LIST

Patent Literature

Patent Literature 1: International Patent Publication No. 01/63972
Patent Literature 2: Japanese Patent Publication No. 2017-168818

SUMMARY OF INVENTION

An electrostatic chuck according to one aspect of the present disclosure includes an insulating base body and a layered electrode. The base body includes a predetermined surface. The electrode runs along the predetermined surface inside the base body. An upper surface of the electrode which faces a side where the predetermined surface is located and the base body are in contact. A gap which is rendered a vacuum or is filled with a gas is interposed between a side surface of the electrode and the base body.

An electrostatic chuck according to another aspect of the present disclosure includes an insulating base body and a layered electrode. The base body includes a predetermined surface. The electrode runs along the predetermined surface inside the base body. An upper surface of the electrode which faces a side where the predetermined surface is located and the base body are in contact. A gap which is rendered a vacuum or is filled with a gas is interposed between a lower surface of the electrode which faces an opposite side to the predetermined surface and the base body.

A method for manufacturing an electrostatic chuck according to one aspect of the present disclosure includes a recess forming step, material placing step, stacking step, and firing step. In the recess forming step, a recessed part is formed in a predetermined planar shape on a first major surface of a first ceramic green sheet or a second major surface of a second ceramic green sheet. In the material placing step, the material for an electrode is placed in a planar shape that includes an outer edge located on the inside from an outer edge of the predetermined planar shape on one of the first major surface and the second major surface. In the stacking step, after the recess forming step and the material placing step, the first ceramic green sheet and the second ceramic green sheet are stacked so that the first major surface and the second major surface face each other. In the firing step, the mutually stacked first ceramic green sheet and second ceramic green sheet are fired.

DESCRIPTION OF EMBODIMENTS

Figure 1A:
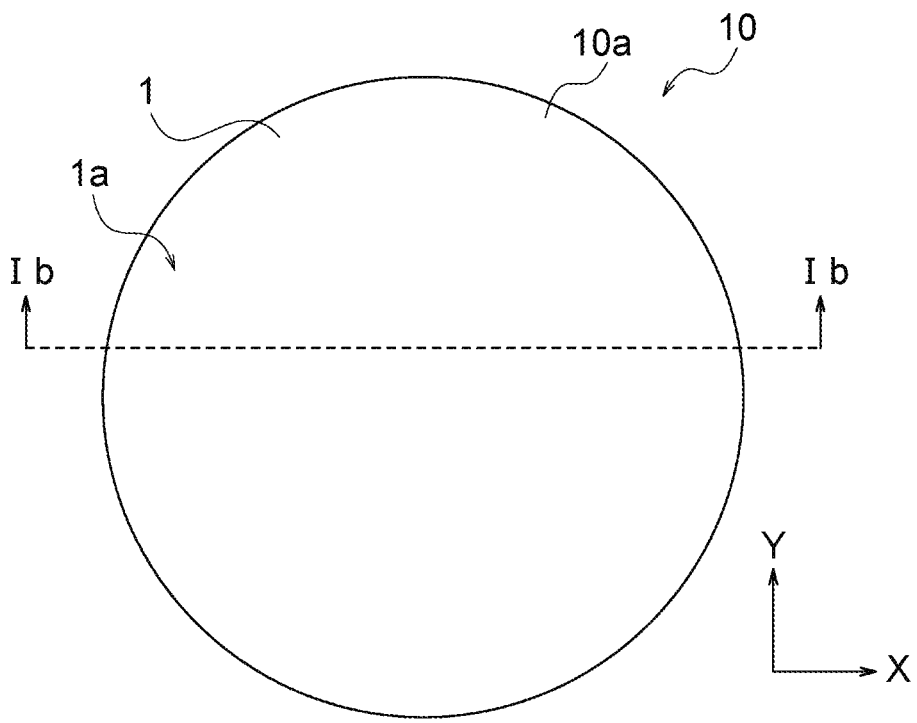
FIG. 1A is a plan view showing the configuration of an electrostatic chuck according to a first embodiment.

Below, electrostatic chucks according to embodiments of the present disclosure will be explained with reference to the drawings. However, the drawings which will be referred to below are schematic ones for convenience of explanation. Accordingly, sometimes details will be omitted. Further, the size ratios will not always coincide with the actual ones. Further, the electrostatic chuck may be further provided with known components which are not shown in the drawings as well.

First Embodiment (Schematic Configuration of Electrostatic Chuck)

Figure 1B:
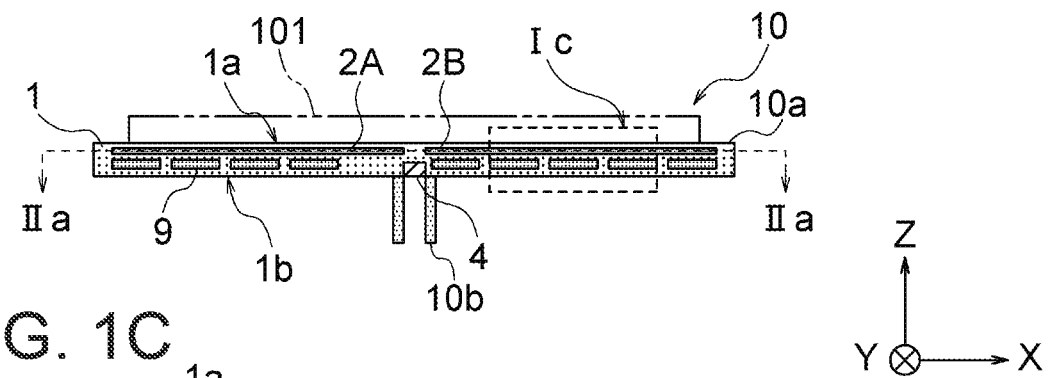
FIG. 1B is a cross-sectional view along the Ib-Ib line in FIG. 1A.
Figure 1C:
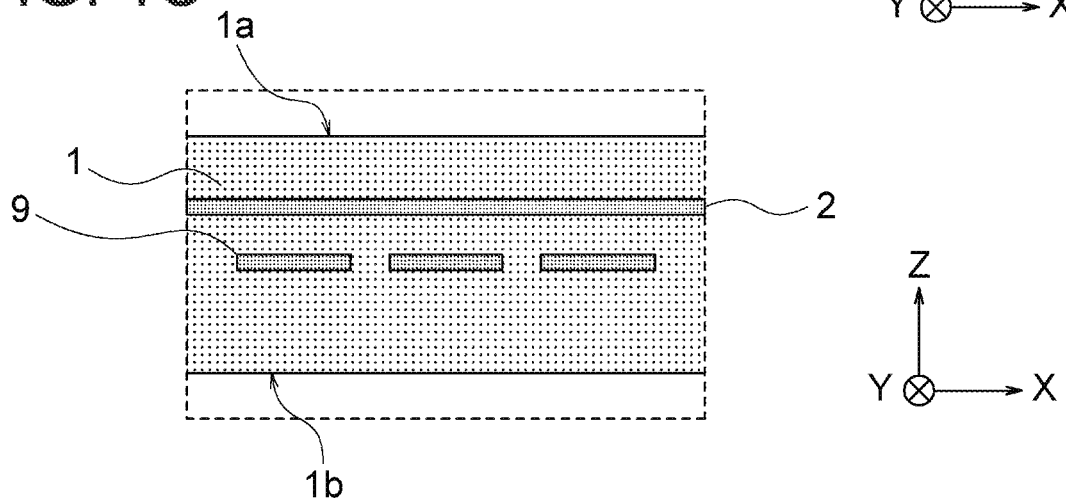
FIG. 1C is an enlarged view of a region Ic in FIG. 1B.
Figure 2A:
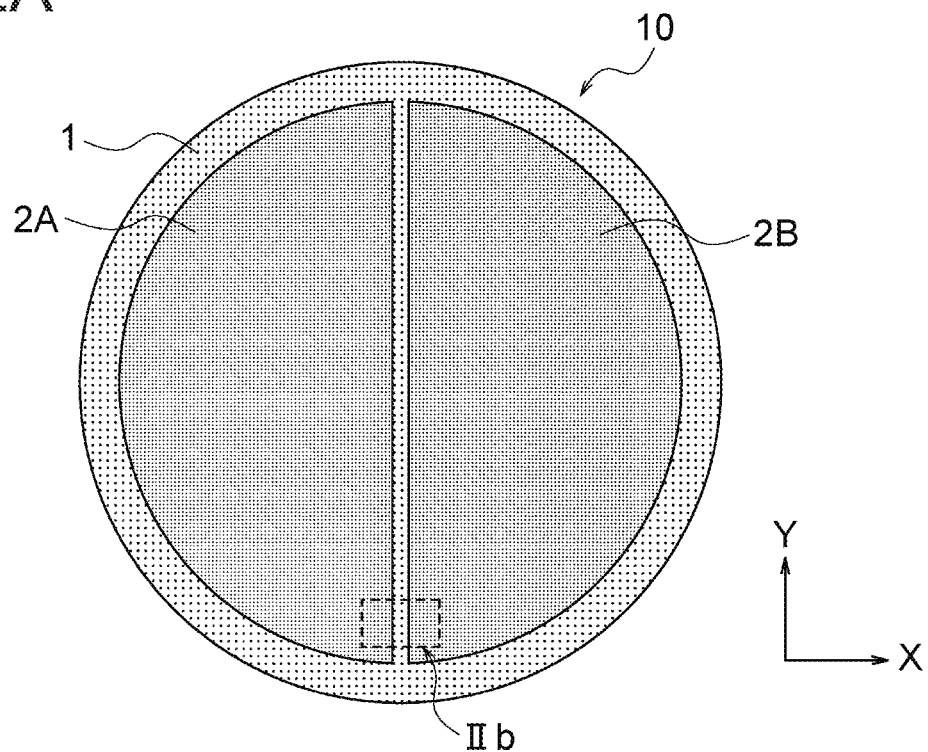
FIG. 2A is a cross-sectional view along the IIa-IIa line in FIG. 1B.

FIG. 1A is a plan view showing the configuration of an electrostatic chuck 10 (below, sometimes the "electrostatic" will be omitted) according to an embodiment. FIG. 1B is a cross-sectional view along the Ib-Ib line in FIG. 1A. FIG. 1C is an enlarged view of a region Ic in FIG. 1B. FIG. 2A is a cross-sectional view along the IIa-IIa line in FIG. 1B.

Cartesian coordinate systems XYZ are attached to these figures. At the time of use of the chuck 10, for example, the positive side of a Z-axis direction is made the upper part. The chuck 10 has a substantially flat-plate shaped plate 10a. Further, the chuck 10 is utilized for holding a wafer 101 which is placed on the plate 10a. Note that, the chuck 10, for example, in addition to the plate 10a, may have a pipe 10b which hangs down from the plate 10a, a not shown cable which is connected to the plate 10a, and/or a not shown control part which controls the supply of power to the plate 10a as well.

An upper surface 1a and lower surface 1b of the plate 10a are for example substantially flat surfaces. The planar shape and various dimensions of the plate 10a may be suitably set considering the shape and dimensions etc. of a held object. For example, the planar shape is circular (example shown) or rectangular. When giving one example of the dimensions, a diameter is 20 cm to 35 cm, and a thickness is 5 mm to 30 mm.

The plate 10a is for example provided with an insulating base body 1, a pair of electrodes 2A and 2B (below, sometimes "A" and "B" will be omitted) and a resistance heating element 9 which are buried in the base body 1, and a plurality of terminals 4 (only one is shown) for supplying power to the electrodes 2 or resistance heating element 9.

By application of voltage to the electrodes 2, the base body 1 is charged, and the wafer 101 is clamped to the upper surface 1a of the base body 1. As this clamping force, for example, there can be mentioned a Coulomb force, Johnsen-Rahbeck force, or gradient force. Depending on which force is utilized, the configurations of the details in the chuck 10 (for example, the material of the base body 1, the thickness of the base body 1 above the electrodes 2, and/or the shapes of the electrodes 2) will differ. In the electrostatic chuck according to the present disclosure, any type of force may be utilized.

As will be understood from provision of the resistance heating element 9, in the example shown, the chuck 10 acts also as a heater for heating the wafer 101. However, the chuck 10 acting also as a heater is not an essential requirement. The resistance heating element 9 need not be provided. Conversely, the chuck 10 may have another function other than heating as well. For example, the chuck 10 may have a flow path in which a fluid used as a cooling medium and/or as a purge gas flows as well.

Although not particularly shown, the electrostatic chuck 10 may have a wiring pattern for connecting the terminals 4 and the electrodes 2 or resistance heating element 9 in a layer which is separate from the layer for the electrodes 2 and resistance heating element 9 as well.

The outer shape of the base body 1 forms the outer shape of the plate 10a. Accordingly, the explanation relating to the shape and dimensions of the plate 10a explained above may be grasped as the explanation of the outer shape and dimensions of the base body 1 as it is. The material of the base body 1 is for example a ceramic. The ceramic is for example a sintered body containing aluminum nitride (AlN), aluminum oxide ($Al_2O_3$), silicon carbide (SiC), silicon nitride ($Si_3N_4$), or the like as a principal ingredient. The base body 1 need not be configured by the same material in its entirety. For example, materials which are different from each other may be used on the upper surface 1a side and the lower surface 1b side as well.

The two electrodes 2 are not connected to each other and are given potentials different from each other. That is, the electrostatic chuck 10 is a so-called bipolar type. The electrodes 2 are layered conductors which are along (for example are parallel to) the upper surface 1a of the base body 1. When viewed on a plane, the two electrodes 2 for example extend in solid patterns so as to equally divide substantially the entire surface of the base body 1 into two. The planar shapes thereof may be suitably set. In the example shown, each electrode 2 becomes substantially a semicircular shape. Further, the two electrodes 2 have straight parts facing each other in parallel.

The thicknesses (Z-direction) of the electrodes 2 are for example constant over the entire surfaces of the electrodes 2. The specific values thereof may be suitably set. When explaining one example, the thicknesses of the electrodes 2 are 0.1 μm to 200 μm. The depths of the electrodes 2 from the upper surface 1a of the base body 1 may be suitably set in accordance with the type of the force utilized as the clamping force and a permittivity of the base body 1 and the like. When explaining one example, the depths of the electrodes 2 from the upper surface 1a of the base body 1 are 10 μm to 10 mm.

The material of the electrodes 2 is for example a metal. The type of metal may be suitably selected. For example, it may be tungsten (W), tungsten carbide (WC), or molybdenum (Mo) or alloys containing them as principal ingredients. Further, the material of the electrodes 2 may be obtained by firing a conductive paste containing a metal as explained before. That is, the material of the electrodes 2 may contain an additive such as glass powder and/or ceramic powder (from another viewpoint, inorganic insulator) as well.

The resistance heating element 9 substantially extends along (for example parallel to) the upper surface 1a of the base body 1, on the side closer to the lower surface 1b of the base body 1 from the electrodes 2. Further, the electrodes 2, when viewed on a plane, for example, extend over substantially the entire surface of the base body 1. By running current in the resistance heating element 9, heat is generated according to Joule's law and, in turn, the wafer 101 placed on the upper surface 1a of the base body 1 is heated.

The resistance heating element 9 may be one made of a layered conductor as in the example shown or, unlike the illustration, may be one including a coil configured by a wire material wound spirally around a coil axis and with the coil axis arranged so as to extend along the upper surface 1a of the base body 1. The pattern (route of the coil axis in the case of a coil shape) of the resistance heating element 9 when viewed on a plane may be suitable one. For example, the resistance heating element 9, when viewed on a plane, may extend in a meandering state or may extend in a spiral state. The material, dimensions, depth from the upper surface 1a, and the like of the resistance heating element 9 may be suitably set as well.

The plurality of terminals 4 are for example positioned at the center side of the base body 1 when viewed on a plane and are exposed from the lower surface 1b of the base body 1 to an external portion of the base body 1. Note that, the terminals 4 may also be located at positions other than the center of the base body 1 when viewed on a plane. The plurality of terminals 4, although not particularly shown, for example include two terminals which are individually connected to the electrodes 2A and 2B and two terminals which are connected to the two ends of the resistance heating element 9. The terminals 4 for example may be connected to the parts of the electrodes 2 or resistance heating element which are positioned just above the terminals 4 directly or through via conductors or may be connected to suitable positions of the electrodes 2 or resistance heating element 9 through layered wirings formed in the base body 1. One terminal 4 may be connected with respect to a plurality of positions in one electrode 2 as well.

(Gaps in Electrostatic Chuck)

Figure 2B:
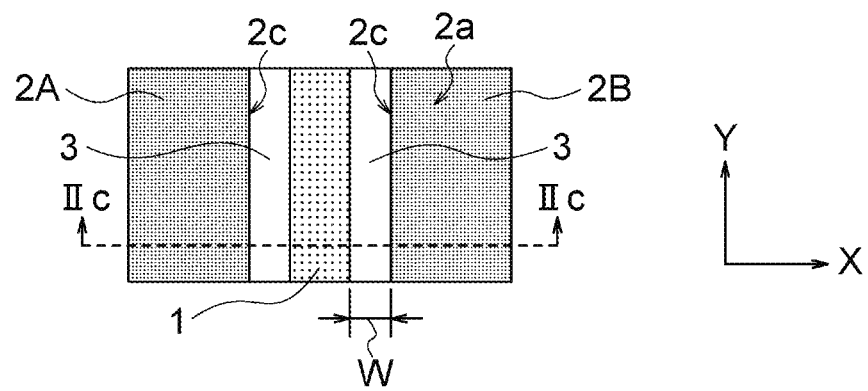
FIG. 2B is an enlarged view of a region IIb in FIG. 2A.
Figure 2C:
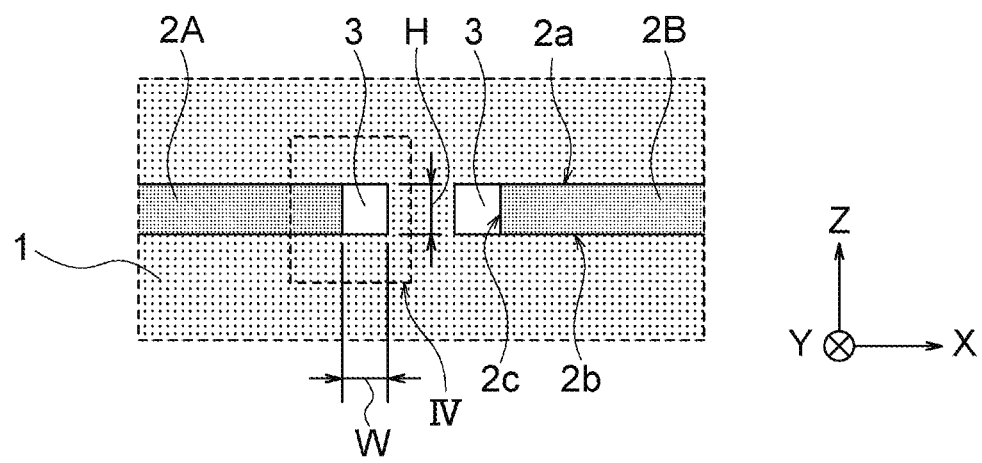
FIG. 2C is a cross-sectional view along the IIc-IIc line in FIG. 2B.

FIG. 2B is an enlarged view of a region IIb in FIG. 2A. FIG. 2C is a cross-sectional view along the IIc-IIc line in FIG. 2B. These views are enlarged views of the cross-section of the straight portions at the outer edges of the electrodes 2 (outer edges when viewed on a plane, below, the same is true). However, the cross-section of the arc-shaped portions at the outer edges of the electrodes 2 may be basically the same as the cross-section of the straight portions.

Each electrode 2 has an upper surface 2a facing the upper surface 1a side of the base body 1, a lower surface 2b facing the lower surface 1b side of the base body 1, and side surfaces 2c (two of the straight portion and arc-shaped portion when viewed on a plane) connecting the upper surface 2a and the lower surface 2b. In the example shown, the upper surface 2a and lower surface 2b and the side surface 2c are substantially planar shaped and are perpendicular to each other. Note that, unlike the example shown, a boundary between the upper surface 2a (or lower surface 2b) and the side surface 2c need not always be clear.

The upper surface 2a and the lower surface 2b of the electrode 2 contact the base body 1. On the other hand, in the side surface 2c, at least a portion (entirety in the example shown) does not contact the base body 1, and a gap 3 is positioned between the side surface 2c and the base body 1. Note that, the upper surface 2a of the electrode 2 need not completely contact the base body in its entirety, and a gap may exist in a portion as well. This gap is for example smaller compared with the gap 3 in contact with the side surface 2c.

The gap 3 is rendered a vacuum or filled with a gas. The gas is for example air or nitrogen. The dielectric constant in vacuum in theory is 1. Further, in general, the dielectric constant of the gas is near 1. For example, the dielectric constant in the gap 3 is smaller than the dielectric constant of the base body 1. Note that, the dielectric constant of the base body 1 is for example 4 to 12. Further, in theory, a vacuum gap 3 does not transfer heat. Further, usually, a thermal conductivity of the gas is lower than the thermal conductivity of the insulation material configuring the base body 1.

The gap 3 basically continuously extends over the entirety of the outer edge of the electrode 2. However, due to error or intent, an interrupted portion may be formed in the middle as well. In other words, the gap 3 includes a portion continuously extending along the outer edge of the electrode 2. The length of this portion is for example longer than the width W of the gap 3, longer than 10 times the width W, or longer than 80% of the length of the outer edge of the electrode 2.

The shape and size of the transverse cross-section of the gap 3 (cross-section perpendicular to the outer edge of the electrode 2) may be constant or may change along the outer edge of the electrode 2. The change may be intentional or may be caused by manufacturing error. Note that, when the length of the portion where the gap 3 continuously extends along the outer edge of the electrode 2 is compared with the width W of the gap 3, the width W may be a mean value or the maximum value in the entirety of the length of the gap 3 or the length of this portion.

Note that, on one transverse cross-section, the width of the gap 3 sometimes differs according to the position in the up and down direction (see later explained FIG. 4B). In the present disclosure, when simply referring to the "width of the gap 3", for example, as shown by the width W in FIG. 4B, it designates the maximum width in each transverse cross-section at the time of plane perspective.

In the explanation of the embodiments, unless particularly explained otherwise, the shape and size of the transverse cross-section of the gap 3 (and the side surface 2c of each electrode 2 and its peripheral portion) are basically made substantially constant along the outer edge of the electrode 2. That is, it is assumed that the explanation concerning the shapes and dimensions of the electrode 2 and gap 3 in one transverse cross-section which will be explained later stands in substantially the same way also in the other transverse cross-sections (the same is true for various specific examples and second and following embodiments which will be explained later). Note that, where the shape and size of the transverse cross-section are not constant along the outer edge of the electrode 2, the explanation given below may stand only in a predetermined range of the outer edge of the electrode 2 as well.

The shape of the transverse cross-section of the gap 3 may be suitably set as will be understood also from various specific examples according to the shape of the transverse cross-section which will be explained later. In FIG. 2C, a rectangle is illustrated as the shape of the transverse cross-section of the gap 3. This rectangle has two sides which are substantially parallel to the upper surface 1a and lower surface 1b of the base body 1 and two sides which are perpendicular to the former two sides. The two sides which are substantially parallel to the upper surface 1a and the lower surface 1b of the base body 1 are for example substantially flush with the upper surface 2a and lower surface 2b of the electrode 2. That is, in FIG. 2C, the height H (size in the Z-axis direction) of the gap 3 is made equal to the thickness of the electrode 2.

Also, the height H, width W, and other various dimensions of the gap 3 may be suitably set. For example, the height H of the gap 3 (for example the maximum value, mean value, or minimum value where the height is not constant in the width direction) may be smaller than the thickness of the electrode 2 (for example a mean value excluding the portion in the vicinity of the side surface 2c, the same is true in the present disclosure unless particularly explained otherwise), may be equal (for example a difference of the two is less than 10% of the thickness of the electrode 2) to the thickness of the electrode 2, or may be larger than the thickness of the electrode 2. Further, the width W of the gap 3 may be smaller than, may be equal to, or may be larger than the height H of the gap 3 (for example the maximum height where the height is not constant). When explaining one example of the width W, for example, it is 10 μm to 500 μm, and/or it is 1/10 to 20 times the maximum height of the gap 3 or the thickness of the electrode 2. Note that, also in various specific examples according to the shape of the transverse cross-section of the gap 3 which will be explained below, the dimensions of the height and width and the size relationships of the two may be suitably set.

Various Specific Examples According to Transverse Cross-Sectional Shape of Gap

FIG. 3A to FIG. 4C are views showing various specific examples of the shape in the transverse cross-section of the gap 3 and correspond to the region IV in FIG. 2C. Note that, FIG. 2C may be grasped as a specific example in which the shape of the transverse cross-section of the gap 3 is rectangular, or may be grasped as one abstractly showing the later explained various specific examples.

First Specific Example of Transverse Cross-Sectional Shape

Figure 3A:
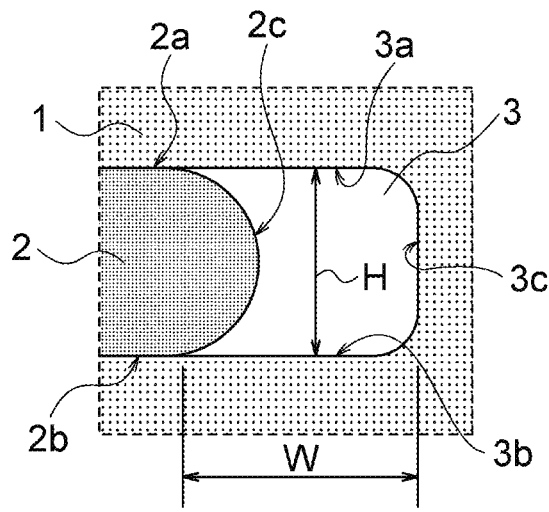
FIG. 3A, FIG. 3B, FIG. 3C, and FIG. 3D are views showing first to fourth specific examples relating to a transverse cross-sectional shape of a gap in the electrostatic chuck according to the embodiments.

In the example in FIG. 3A, a corner portion formed by the side surface 3c of the gap 3 (the surface on the opposite side to the electrode 2) and the upper surface 3a or lower surface 3b of the gap 3 is chamfered. The chamfered surface may be a curved surface state as illustrated or may be planar shape unlike the illustration. Note that, although not particularly shown, the entirety of the side surface 3c may be a curved surface in shape with the electrode 2 side formed recessed.

Further, in the example in FIG. 3A, the side surface 2c of the electrode 2 becomes a projecting surface bulging outward. This projecting surface is for example a substantially curved surface. That is, the change in the orientation of the tangential line of the projecting surface is basically continuous. However, in the side surface 2c, there may be irregularities which are very smaller than the height H and width W of the gap 3 as well.

Second Specific Example of Transverse Cross-Sectional Shape

Figure 3B:
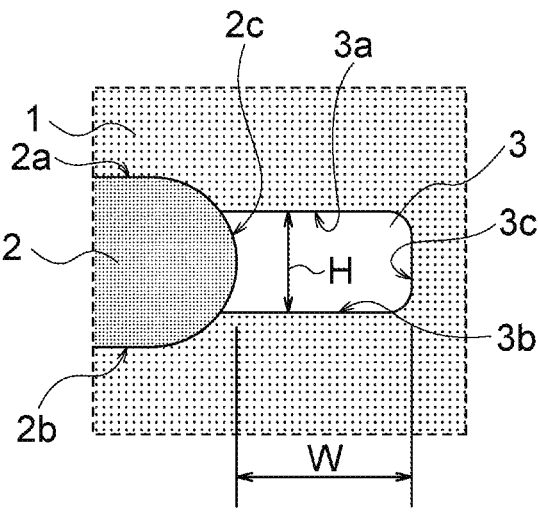

In the example in FIG. 3B, the shape of the gap 3 (and the shape of the side surface 2c of the electrode 2) are the same as those in the example in FIG. 3A. However, in contrast to the example in FIG. 3A in which the height H of the gap 3 was equal to the thickness of the electrode 2, in the example in FIG. 3B, the height H of the gap 3 becomes smaller than the thickness of the electrode 2. In other words, the gap 3 includes a portion (entirety of the gap 3 in the present example) where the height is smaller than the thickness of the electrode 2. From another viewpoint, the side surface 2c of the electrode 2 is in contact with the gap 3 only in a portion. The other portion of the side surface 2c is in contact with the base body 1.

The specific value of the height of a portion in the gap 3 that is smaller than the thickness of the electrode 2 and/or the length parallel to the up and down direction of the portion of the side surface 2c of the electrode 2 which is in contact with the gap 3 (length ignoring a curve etc. of the side surface 2c) may be suitably set. For example, these values may be less than 9/10 of the thickness of the electrode 2, may be less than 1/2, or may be less than 2/5. Further, these values are for example 1 μm or more and/or 1% or more of the thickness of the electrode 2.

Note that, in various examples which will be explained later, sometimes the gap 3 has a portion with a height smaller than the thickness of the electrode 2 and/or the side surface 2c of the electrode 2 contacts the gap 3 at only a portion in the up and down direction. Specific values of sizes in the up and down direction in the examples may be suitably set in the same way as that described above. However, in the explanation of various examples which will be given later, basically only the values of sizes in the actually shown examples will be referred to. In FIG. 3B, the height of the gap 3 (the length in the up and down direction of the portion of the side surface 2c contacting the gap 3) is made 1/2 or more and less than 9/10 of the thickness of the electrode 2.

The position of the portion of the side surface 2c of the electrode 2 which is in contact with the gap 3 may be suitably set. For example, this portion, as illustrated, may be a portion not connected to either the upper surface 2a or lower surface 2b or, unlike the illustration, may be a portion connected with the upper surface 2a or a portion connected with the lower surface 2b. Further, when this portion is not connected to either the upper surface 2a or lower surface 2b, it may be positioned at substantially the center of the thickness of the electrode 2 or, unlike the illustration, may be closer to the upper surface 2a side or lower surface 2b side.

Note that, in the later explained various examples as well, sometimes a portion of the side surface 2c of the electrode 2 contacts the gap 3. The position at which the side surface 2c contacts the gap 3 in such examples may be various positions in the same way as those described above. However, in the explanation of the later explained various examples, basically only the positions in the actually shown examples will be referred to. In FIG. 3B, the portion contacting the gap 3 in the side surface 2c is positioned at the center in the thickness of the electrode 2. The portion contacting the gap 3 being positioned at the center of the thickness of the electrode 2 means for example the state where the center position in the up and down direction of this portion falls within 1/3 of the center side of the thickness of the electrode 2.

Third Specific Example of Transverse Cross-Sectional Shape

Figure 3C:
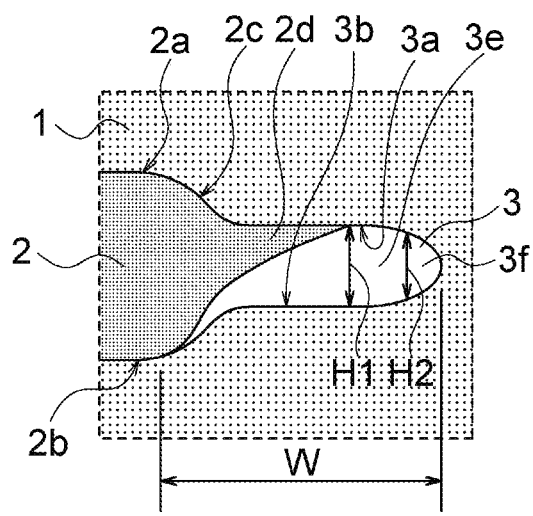

In the example in FIG. 3C, the electrode 2 has a projecting part 2d on the side surface 2c. The projecting part 2d is in contact with the base body 1 at the upper side surface and is separated from the base body 1 at the lower side surface. That is, the gap 3 which is rendered a vacuum or filled with a gas extends between the lower side surface of the projecting part 2d and the base body 1.

In the projecting part 2d, the specific shape, thickness (up and down direction), amount of projection (horizontal direction, direction perpendicular to the outer edge of the electrode 2 when viewed on a plane), relative size with respect to the gap 3, and the like may be suitably set. In the example shown, the projecting part 2d is given a tapered shape so as to become thinner toward the front end side. The length in the horizontal direction (direction perpendicular to the outer edge of the electrode 2 when viewed on a plane) of the surface at which the projecting part 2d and the gap 3 are in contact is for example 1/3 or more of the width W of the gap 3.

Further, in the example of FIG. 3C, the gap 3 has a first height portion 3e having a height H1 and a second height portion 3f having a height H2 lower than the height H1. The second height portion 3f is positioned on the opposite side from the side surface 2c of the electrode 2 relative to the first height portion 3e.

The shapes and sizes etc. of the first height portion 3e and second height portion 3f may be suitably set. In the example shown, the height H1 becomes further smaller than the height H of the gap 3 in the example in FIG. 3B and becomes 2/5 or more and less than 1/2 of the thickness of the electrode 2. The first height portion 3e, when assuming that the projecting part 2d is not provided, extends from the electrode 2 side to the opposite side to the electrode 2 with substantially a constant height. In the example shown, by the projecting part 2d entering into an upper part of the space forming the gap 3, the gap 3 includes a portion lower in height than the first height portion 3e on the side closer to the electrode 2 from the first height portion 3e. The second height portion 3f is given a tapered shape so as to become thinner toward the tip end side (opposite side to the electrode 2).

Fourth Specific Example of Transverse Cross-Sectional Shape

Figure 3D:
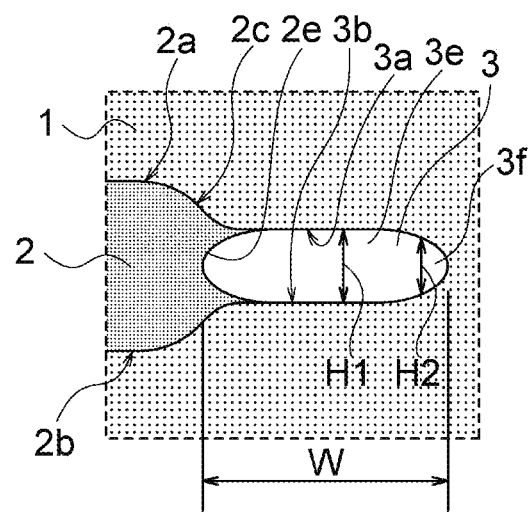

In the example in FIG. 3D, if considering the case with no electrode 2, the shape and size of the void in the base body 1 (including the gap 3) are substantially the same as the shape and size in FIG. 3C. However, in contrast to the example in FIG. 3C in which the electrode 2 had the projecting part 2d on the side surface 2c, in the example in FIG. 3D, the electrode 2 has a recessed part 2e in the side surface 2c. From another viewpoint, the gap 3 has a portion entering into the side surface 2c of the electrode 2. This portion includes a portion that is lower in height than the first height portion 3e.

The shape and size etc. of the recessed part 2e may be suitably set. In the example shown, the recessed part 2e is given a tapered shape so as to become smaller in diameter in the up and down direction (thickness direction of the electrode 2) the further toward the bottom surface side (inner side in a plane direction of the electrode 2). The maximum diameter in the up and down direction (diameter on the opening surface) of the recessed part 2e is for example smaller than the thickness of the electrode 2 and becomes ⅓ to 1 time the height of the gap 3.

Fifth Specific Example of Transverse Cross-Sectional Shape

Figure 4A:
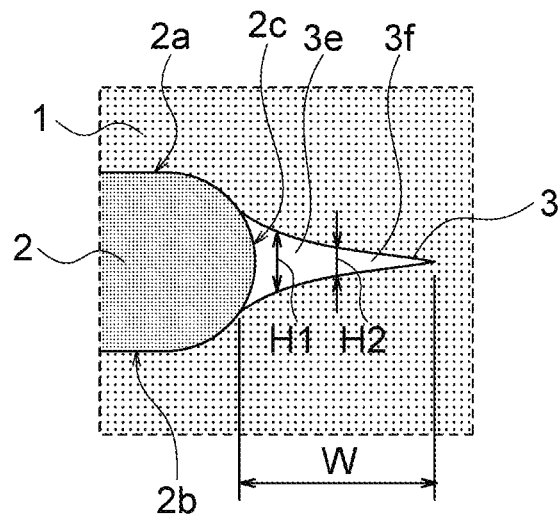
FIG. 4A, FIG. 4B, and FIG. 4C are views showing fifth to seventh specific examples relating to a transverse cross-sectional shape of a gap in the electrostatic chuck according to the embodiments.

In the example in FIG. 4A, the gap 3 is rendered a taper shape in its entirety so as to become smaller in diameter in the up and down direction the further toward the opposite side from the electrode 2. From another viewpoint, in the same way as the examples in FIG. 3C and FIG. 3D, the gap 3 has a first height portion 3e and a second height portion 3f which is positioned on the opposite side from the electrode 2 relative to the first height portion 3e and has a height H2 lower than the height H1 of the first height portion 3e.

However, in contrast to the examples in FIG. 3C and FIG. 3D in which the gap 3 had a portion (notation omitted) lower in height than the first height portion 3e on the side closer to the electrode 2 from the first height portion 3e, in the present example, the first height portion 3e is in contact with the side surface 2c of the electrode 2. In other words, the portion in the gap 3 which contacts the side surface 2c is a portion where the height is the maximum in the gap 3. The height of this portion is for example made smaller than the thickness of the electrode 2.

Sixth Specific Example of Transverse Cross-Sectional Shape

Figure 4B:
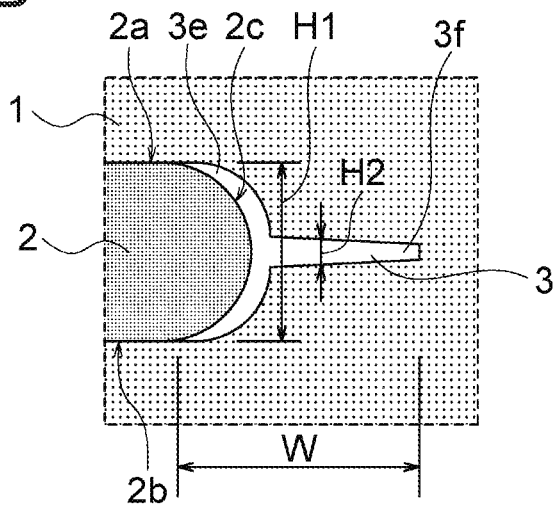

In the example in FIG. 4B, in the same way as FIG. 3C to FIG. 4A, the gap 3 has a first height portion 3e having a height H1 and a second height portion 3f which is positioned on the opposite side from the electrode 2 relative to the first height portion 3e and has a height H2 lower than the height H1. Further, in the gap 3, in the same way as FIG. 4A, the first height portion 3e is in contact with the side surface 2c of the electrode 2.

However, in the present example, the height of the gap 3 does not become lower gradually as in the already explained other examples, but the height of the gap 3 becomes lower stepwise. That is, the change of the height between the first height portion 3e and the second height portion 3f is relatively rapid, and the second height portion 3f forms a shape that projects from the first height portion 3e to the side opposite to the electrode 2.

The shapes and sizes etc. of the first height portion 3e and second height portion 3f may be suitably set. In the example shown, the first height portion 3e has the height H1 which is substantially equal to the thickness of the electrode 2. Further, it has a side surface bulging to the opposite side from the side surface 2c of the electrode 2. The height H1 is for example ⅘ or more of the thickness of the electrode 2. The second height portion 3f has the height H2 lower than the height H1 and has a width larger than the height H2.

Note that, as will be understood from the height H1 in FIG. 4B, when the gap 3 is divided into upper and lower parts due to a projecting surface or projecting part of the side surface 2c of the electrode 2, the height H of the gap 3 may be defined not after division but assuming no division by the projection surface or the like of the electrode 2.

Seventh Specific Example of Transverse Cross-Sectional Shape

Figure 4C:
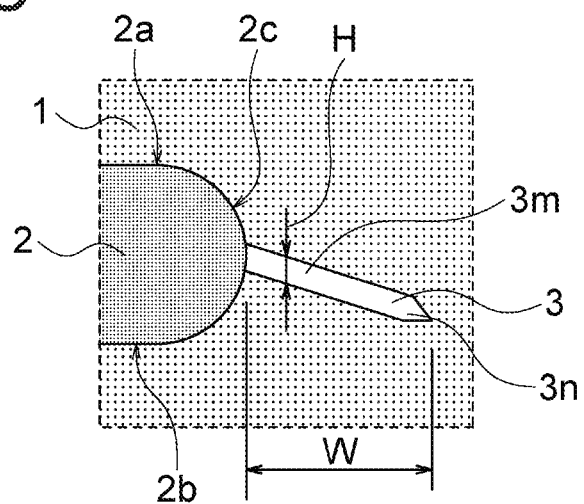

In the example in FIG. 4C, the gap 3 is inclined so that it is positioned lower the more it is separated from the side surface 2c of the electrode 2. In other words, the gap 3 includes a first position part 3m and a second position part 3n which is positioned on the side opposite to the side surface 2c relative to the first position part 3m and lower the more from the first position part 3m. Note that, the second position part 3n being positioned lower than the first position part 3m referred to here does not mean that the entirety of the second position part 3n is positioned lower than the entirety of the first position part 3m, but means that a reference position (for example the center position in the up and down direction) of the second position part 3n is positioned lower than the reference position (for example, the center position in the up and down direction) of the first position part 3m.

The shapes and sizes etc. of the first position part 3m and second position part 3n may be suitably set. In the example shown, the gap 3 extends in a straight shape with a substantially constant height H, and the first position part 3m and the second position part 3n have shapes and heights which are equal to each other. The gap 3 is for example in contact with respect to substantially the center of the side surface 2c of the electrode 2, and the tip end of the gap 3 (opposite side to the side surface 2c) is positioned somewhat above the lower surface 2b of the electrode 2.

Note that, as described above, in the second position part 3n, the center position of its height H only has to be positioned lower than the center position of the height H of the first position part 3m. Accordingly, for example, even a case where the gap 3 is a triangle shape formed by a horizontal lower surface and upper surfaces which are inclined so as to be positioned lower the more separated from the side surface 2c of the electrode 2, it can be said that the first position part 3m and second position part 3n are provided. Further, for example, in the example in FIG. 4B, even a case where the center position of the height H2 of the second height portion 3f is positioned lower than the center position of the height H1 of the first height portion 3e, it can be said that the gap 3 has the first position part 3m and second position part 3n.

Eighth Specific Example of Transverse Cross-Sectional Shape

Figure 12:
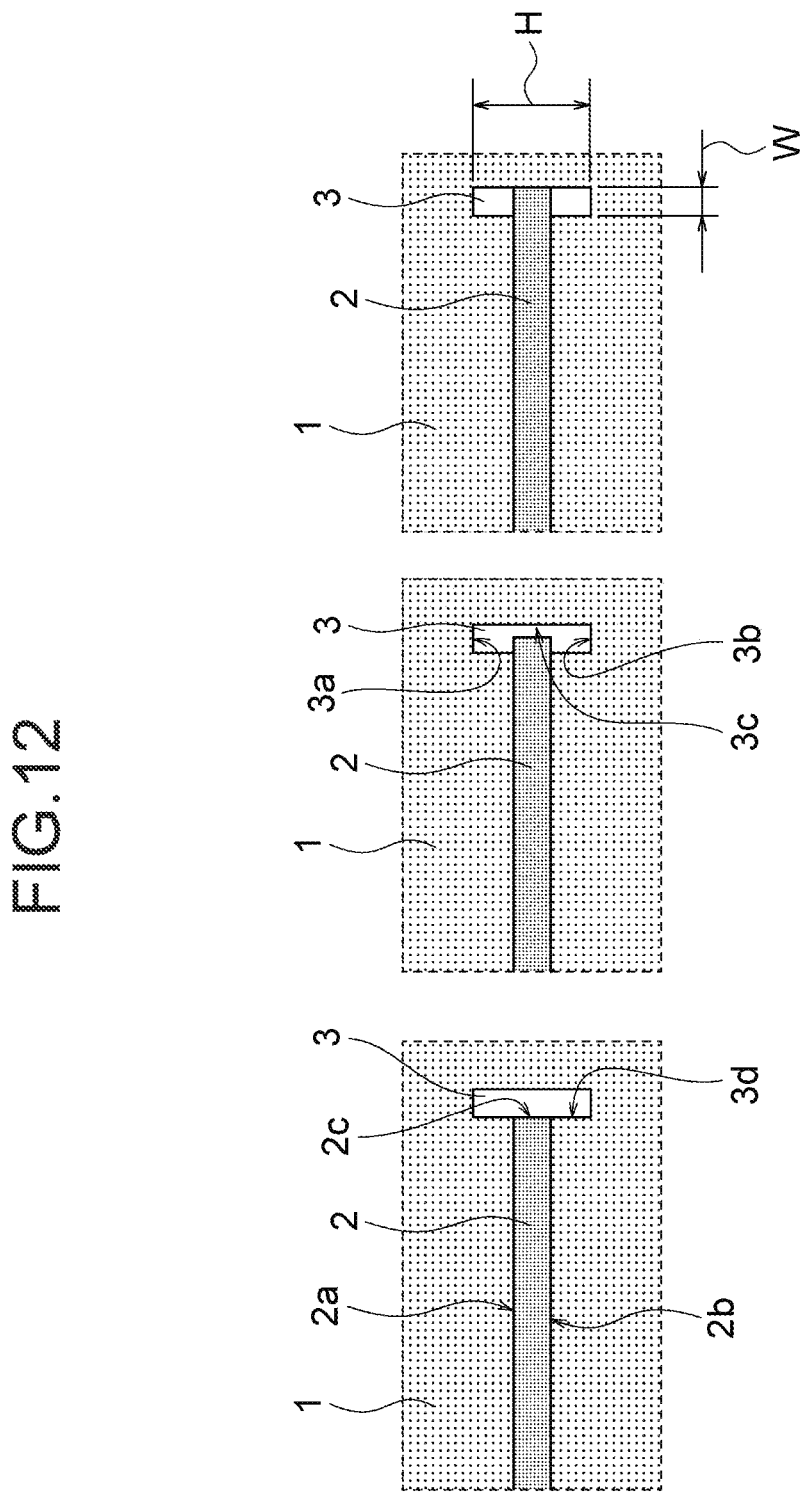
FIG. 12 is a view showing an eighth specific example of the gaps in the electrostatic chuck according to the embodiments.

FIG. 12 is a view showing an eighth specific example of the shape of the transverse cross-section of the gap 3 and for example corresponds to the left side half in FIG. 2C. However, here, cross-sections at three mutually different positions in a direction along the outer edge of the electrode 2 are shown.

In this example, the height H of the gap 3 becomes larger than the thickness of the electrode 2. In more detail, the gap 3 extends upward more than the electrode 2 and extends downward more than the electrode 2. In other words, the upper surface 3a of the gap 3 is positioned above the upper surface 2a of the electrode 2, and the lower surface 3b of the gap 3 is positioned below the lower surface 2b of the electrode 2.

However, in the case where the height H is larger than the thickness of the electrode 2, the upper surface 3a may be positioned above the upper surface 2a while the lower surface 3b may be flush with the lower surface 2b or the lower surface 3b may be positioned between the lower surface 2b and the upper surface 2a. In the same way, in the case where the height H is larger than the thickness of the electrode 2, the lower surface 3b is positioned below the lower surface 2b while the upper surface 3a may be flush with the upper surface 2a or the upper surface 3a may be positioned between the upper surface 2a and the lower surface 2b.

In a gap 3 with a height H larger than the thickness of the electrode 2, the height H may be larger than, may be equal to, or may be smaller than the width W of the gap 3 (example shown). Further, the specific values of the height H and width W in this specific example may also be within ranges of sizes explained with reference to FIG. 2C. For example, the height H may be made 1.1 times to 20 times the thickness of the electrode 2. Further, the height H may be made larger than 20 times the thickness of the electrode 2 as well.

In the explanation of FIG. 2C, it was stated that there may be a portion where the gap 3 is interrupted in the direction along the outer edge of the electrode 2 due to error or intent. In other words, this means that there may be a portion where the side surface 2c of the electrode 2 contacts the base body 1 as well. FIG. 12 shows also variation caused by error or intent in the positional relationships between the side surface 2c and the gap 3 in the width direction of the electrode 2.

Specifically, on the left side in FIG. 12, a configuration is shown where the side surface 2c of the electrode 2 and a side surface 3d of the gap 3 on the electrode 2 side are substantially flush. At the center in FIG. 12, a configuration is shown where the side surface 2c is positioned inside the gap 3 (positioned between the side surface 3c and the side surface 3d). On the right side in FIG. 12, a configuration is shown where the side surface 2c abuts against the side surface 3c of the gap 3 on the side opposite to the electrode 2. Although not particularly shown, in the electrode 2, a portion other than the side surface 2c may contact the side surface 3c etc. by bending in the gap 3 or the like.

In the case of the variation as described above, any configuration may have a larger ratio of occupation in the direction along the outer edge of the electrode 2. Further, in FIG. 12, the explanation was given assuming that the plurality of configurations described above were located at mutually different positions in the direction along the outer edge of one electrode 2. However, any configuration may be occupied over substantially the entirety of the outer edge of one electrode 2 as well.

The various specific examples described above may be suitably combined. For example, in the examples in FIG. 3A, FIG. 3B, and FIG. 4A to FIG. 4C, the side surface 2c of each electrode 2 was formed as a projecting surface in its entirety. However, as shown in FIG. 3C or FIG. 3D, the side surface 2c may be shaped so as to have the projecting part 2d or recessed part 2e. Conversely, in FIG. 3C and FIG. 3D, the entire surface of the side surface 2c may be formed as a projecting surface as well.

Further, for example, in FIG. 3C, FIG. 3D, FIG. 4A, and FIG. 4C, the height of the portion in the gap 3 which was in contact with the side surface 2c of the electrode 2 (from another viewpoint, the height H1 and/or maximum height) was made smaller than the thickness of the electrode 2. However, in the same way as the example in FIG. 3A or FIG. 4B, the thickness of this portion may be equal to the thickness of the electrode 2 as well.

Further, for example, the tapered shape of the gap 3 in FIG. 4A and the stepwise change of the height of the gap 3 in FIG. 4B may be combined or the shapes of the gaps 3 in FIG. 3C to FIG. 4B and the inclination of the gap 3 in FIG. 4C may be combined.

Further, for example, in the examples in FIG. 12, in the same way as FIG. 2C, flat surface-shaped surfaces were shown as the side surface 2c of the electrode 2. However, as the shape of the side surface 2c, the shapes in FIG. 3A to FIG. 4C or a combination of them may be applied. For example, in FIG. 12, the side surface 2c may include a projecting surface or recessed surface. Further, for example, in the examples in FIG. 12, rectangular cross-sections were shown as the shape of the transverse cross-section of the gap 3 in the same way as FIG. 3A. However, the shapes in FIG. 3A to FIG. 4C or a combination of them may be applied. For example, in FIG. 12, in the gap 3, the corner portions may be chamfered, the side surface may have a projecting surface or recessed surface, or the height and/or position may change continuously or stepwise.

As described above, in the present embodiment, the electrostatic chuck 10 has the insulating base body 1 having a predetermined surface (upper surface 1a) and the layered electrode 2 along the upper surface 1a in the base body 1. The upper surface 2a of the electrode 2 and the base body 1 are in contact, and a gap 3 which is rendered a vacuum or filled with a gas is interposed between the side surface 2c of the electrode 2 and the base body 1.

Accordingly, for example, after suspending application of voltage to the electrode 2, the residual charge can be quickly removed from the base body 1. As a result, the wafer 101 is smoothly detached from the base body 1, so the productivity can be improved. The reason why the time for removal of the charge can be shortened is for example as follows.

The dielectric constant of the ceramic used in the electrostatic chuck 10 is usually about 10. In contrast, the dielectric constant of the gap 3 (vacuum or gas) is 1 or a value very close to 1, therefore the gap 3 is relatively hard to be charged. For this reason, in the entirety of the base body 1, the accumulated charge becomes smaller corresponding to the volume ratio of the gap 3. Accordingly, the charge to be removed may be made smaller, therefore the charge is removed fast.

Usually, when the ground is electrically connected to the electrode 2, the charge in the portion in the base body 1 which abuts against the electrode 2 easily flows to the ground. Further, by the gap 3 being positioned in the portion adjacent to the electrode 2, the residual charge in the base body 1 easily moves through the inner wall of the gap 3 (easily moves along the inner wall surface). Accordingly, the residual charge in the base body 1 is removed fast through the electrode 2.

So far as a gap is positioned at the side surface 2c of the electrode 2, the thickness of the base body 1 is secured above and below the electrode 2 as it is (from another viewpoint, without increase of the thickness of the electrostatic chuck 10 due to the gap 3), while the charge which is accumulated can be suppressed. By securing the thickness of the base body 1 above and below the electrode 2, for example, the mechanical strength of the base body 1 is improved.

If there is a gap between the electrode 2 and the upper surface 1a of the base body 1, the force clamping the wafer 101 by the chuck 10 falls. However, the gap 3a exists in a state where the upper surface 2a of the electrode 2 and the base body 1 are in contact, thereby the clamping force can be maintained. In this way, in the chuck 10, the mechanical strength and clamping force are maintained while the wafer 101 can be made easier to detach.

Further, in the present embodiment, in a plan view of the upper surface 1a of the base body 1, the gap 3 runs continuously along the side surface 2c of the electrode 2 (outer edge of the electrode 2) with a length larger than the width W from the side surface 2c of the electrode 2.

Accordingly, even if the width of the gap 3 is small, the volume of the gap 3 can be increased. Further, the gap 3 runs continuously along the outer edge of the electrode 2, therefore it is hard for bias to occur in distribution of the charge to be removed. For this reason, this is removed faster, so it is easy to detach the wafer.

Further, in the present embodiment, the gap 3 is formed at the two sides of the electrode 2 in the direction running along the upper surface 1a. For example, the gap 3 is formed in each of the straight portion and arc-shaped portion of the outer edge of the electrode 2.

Accordingly, movement of the charge is promoted at the two sides of the electrode 2, therefore removal of the charge is easy. Also, the liability of the charge moving in only a constant direction and unwanted current becoming larger is reduced as well.

Further, in the present embodiment, the gap 3 may include a portion with a size in the up and down direction (direction perpendicular to the upper surface 1a of the base body 1) smaller than the size in the up and down direction of the electrode 2 (for example FIG. 3B to FIG. 4C) as well.

In this case, for example, the volume of the base body 1 is secured near the outer edge of the electrode 2 and the liability of dielectric breakdown is reduced while the length capable of promoting removal of charge by movement along the surface can be increased.

Further, in the present embodiment, the gap 3 may include a portion where the size in the up and down direction is larger than the size in the up and down direction of the electrode 2 (FIG. 12).

In this case, for example, when the electrostatic chuck 10 greatly changes in temperature, it becomes easier to permit bulging of the electrode 2 at the outer edge of the electrode 2. For example, when the electrode 2 bulges out in a direction along its plane, the outer edge of the electrode 2 can bend upward or downward inside the gap 3 and be displaced over the width W of the gap 3. As a result, for example, stress added to the base body 1 is reduced.

Further, in the present embodiment, the gap 3 may include the first height portion 3e and the second height portion 3f which is positioned on the side opposite to the side surface 2c of the electrode 2 relative to the first height portion 3e and is smaller in size in the up and down direction than the first height portion 3e (FIG. 3C to FIG. 4B).

In this case, for example, due to the second height portion 3f being relatively small, the liability of dielectric breakdown can be reduced while the length for promoting removal of the charge by movement along the surface can be made longer. On the other hand, an effect of bulging of the electrode 2 being absorbed by the first height portion 2e having a relatively large height is exhibited. In particular, when the first height portion 2e is larger than the thickness of the electrode 2 as in FIG. 12, this effect is improved.

Further, in the present embodiment, the gap 3 includes the first position part 3m and the second position part 3n which is positioned on the side opposite to the side surface 2c of the electrode 2 relative to the first position part 3m and lower than the first position part 3m (opposite side to the upper surface 1a of the base body 1).

Accordingly, for example, the gap 3 bends to the opposite side (downward) from the wafer clamping surface, whereby the volume ratio of the base body 1 which is located between the electrode 2 and the upper surface 1a of the base body 1 is increased while the gap 3 can be expanded. As a result, for example, the liability of dielectric breakdown between the electrode 2 and the upper surface 1a is reduced while the residual charge can be quickly removed.

Further, in the present embodiment, the side surface 2c of the electrode 2 may have a projecting surface as well (for example FIG. 3A to FIG. 4C).

In this case, for example, even if the thickness of the electrode 2 is not increased, the area of the electrode 2 contacting the gap 3 can be increased, therefore the residual charge after cutoff of the voltage can be reduced fast.

Further, in the present embodiment, the side surface 2c of the electrode 2 may have the projecting part 2d. The surface of the projecting part 2d on the upper surface 1a side of the base body 1 may contact the base body 1. The gap 3 may include a portion interposed between the surface of the projecting part 2d on the lower surface 1b side of the base body 1 and the base body 1 (FIG. 3C).

In this case, for example, the projecting part 2d easily directs charges more to the upper side portion of the base body 1 than the lower side portion of the base body 1. As a result, for example, the clamping force can be efficiently made larger. Further, from another viewpoint, the contacting area between the electrode 2 and the base body 1 is made larger relative to the volume of the gap 3, therefore the amount of reduction of the charge to be removed is maintained while charging and discharging are made faster.

Further, in the present embodiment, the side surface 2c of the electrode 2 may have the recessed part 2e as well (FIG. 3D).

In this case, for example, from another viewpoint, projecting parts of the electrode 2 are formed on the two sides of the recessed part 2e, therefore the contacting area between the electrode 2 and the base body 1 becomes larger relative to the volume of the gap 3. As a result, for example, the amount of reduction of the charge to be removed is maintained while charging and discharging are made faster. Due to the provision of the two projecting parts, removal of the charge is made faster compared with the case where one projecting part having an equal size is provided.

Second Embodiment

Figure 5:
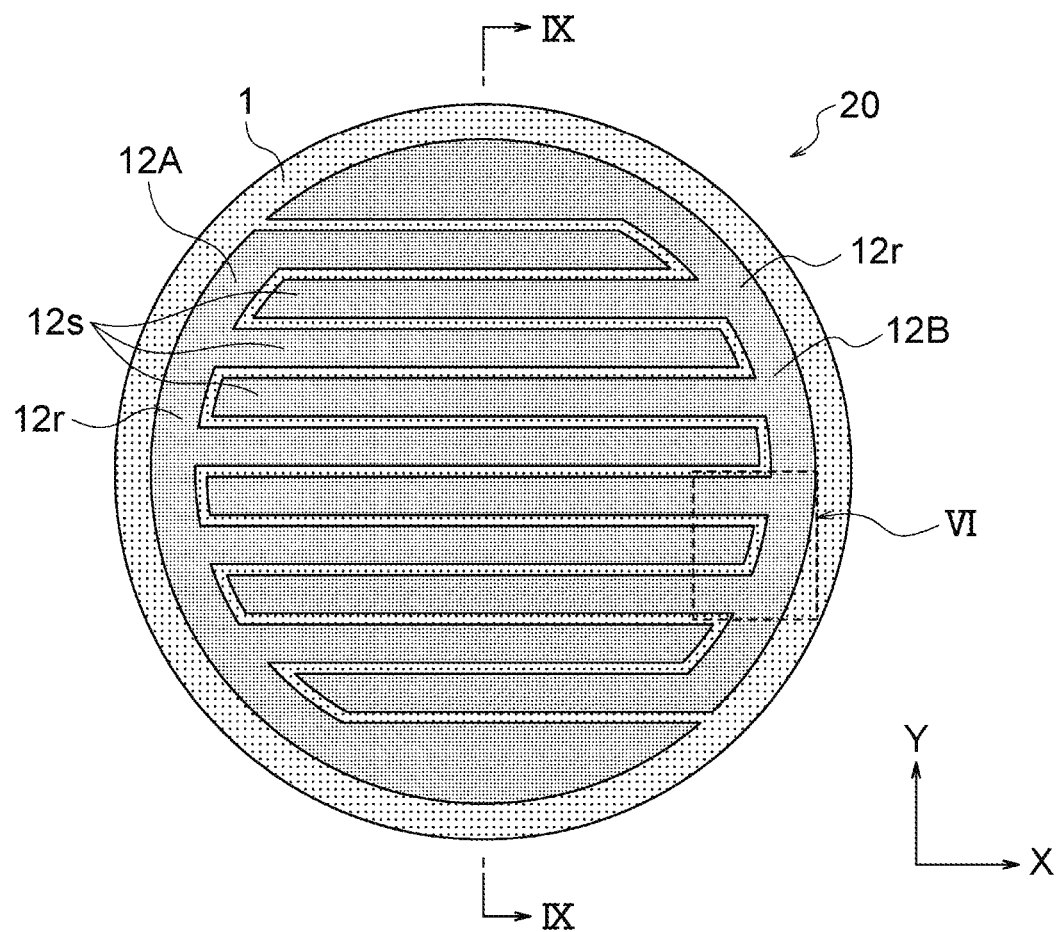
FIG. 5 is a cross-sectional view showing electrodes in an electrostatic chuck according to a second embodiment.

FIG. 5 is a cross-sectional view showing a chuck 20 according to a second embodiment and corresponds to FIG. 2A.

The chuck 20 differs from the first embodiment only in the planar shapes of the electrodes. Note that, along with the difference of the planar shapes of the electrodes, naturally the configuration of the details (for example the thickness of the base body 1 on electrodes) may differ between the first embodiment and the second embodiment as well.

Electrodes 12A and 12B (hereinafter, sometimes "A" and "B" will be omitted) of the chuck 20 are for example formed as a mutually intermeshing pair of comb-shaped electrodes. Specifically, each of the electrodes 12 has a bus part 12r and a plurality of tooth portions 12s which extend from the bus part 12r alongside each other (for example in parallel). Note that, although not particularly shown, the wafer is for example arranged so that its outer edge is superimposed on the bus parts 12r.

The bus parts 12r for example extend with constant widths along the outer edge of the base body 1. In the example shown, in accordance with the outer edge of the base body 1 being circular, the bus parts 12r are arc shaped. The pair of bus parts 12r face each other while sandwiching the center side region of the base body 1 between them when viewed on a plane.

The tooth portions 12s in one electrode 12 for example linearly extend with constant widths from the bus part 12r in the one electrode 1 toward the bus part 12r in the other electrode 12. Further, the tooth portions 12s in one electrode 12 and the tooth portions 12s in the other electrode 12 are alternately arranged one by one in the width direction of the tooth portions 12s. The mutually neighboring tooth portions 12s face each other while separated.

In the pair of electrodes 12, the portions positioned closest to the two sides in the Y-direction (direction of arrangement of the tooth portions 12s) may be grasped as single portions of the bus parts 12r or may be grasped as the tooth portions 12s which are not constant in widths. In the example shown, the widths of the bus parts 12r and the widths of the tooth portions 12s are made equal excluding these unique portions. However, the widths of the two may be different as well.

In the pair of electrodes 12, for example, the widths of the pluralities of tooth portions 12s are the same as each other. Further, the pitches of the plurality of tooth portions 12s are constant. From another viewpoint, the sizes of the gaps among the pluralities of tooth portions 12s are the same as each other. The sizes of the gaps between the tip ends of the pluralities of tooth portions 12s and the bus parts 12r are for example the same as each other. Further, they may be the same as or different from the sizes of the gaps among the pluralities of tooth portions 12s.

Figure 6:
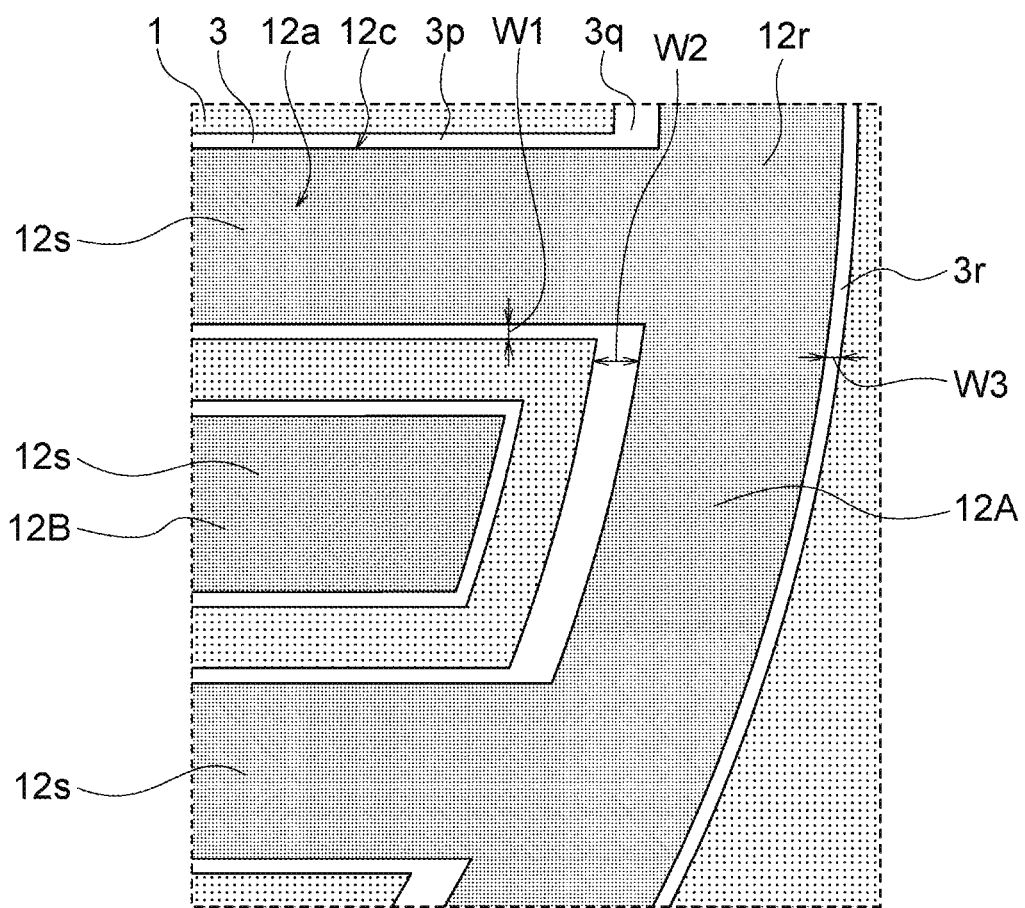
FIG. 6 is an enlarged view of a region VI in FIG. 5.

FIG. 6 is an enlarged view of a region VI in FIG. 5.

In the present embodiment as well, in the same way as the first embodiment, a gap 3 is formed between the side surface 12c of each of the electrodes 12 and the base body 1. Although not particularly shown, the shape of the gap 3 in the cross-section perpendicular to the outer edge of the electrode 12 may be the same as that in the first embodiment. That is, FIG. 2C, FIG. 3A to FIG. 4C, and FIG. 12 may be grasped as the cross-sectional views of the present embodiment by replacing the notation of the electrode 2 with the notation of the electrode 12.

Further, the length of the gap 3 relative to the lengths of the outer edges of the electrodes 12 and the like may be made the same as those in the first embodiment. For example, the gap 3 may continuously extend over the entireties of the lengths of the outer edges of the electrodes 12. Accordingly, for example, the gap 3 includes portions extending along the side surfaces 12c of the bus parts 12r on the two sides in the width direction (X-direction) and along the side surfaces 12c of the tooth portions 12s on the two sides in the width direction (Y-direction).

In the same way as the first embodiment, the shape and dimensions of the gap 3 in the transverse cross-section may be basically made constant along the outer edges of the electrodes 12. However, as shown in FIG. 6, the shapes and/or dimensions of the gap 3 may be different as well between the bus parts 12r and the tooth portions 12s.

In the example shown in FIG. 6, the gap 3 has a first lateral side portion 3p contacting the side surface 12c of the tooth portion 12s and a second lateral side portion 3q contacting the side surface 12c positioned between a plurality of tooth portions 12s in the bus part 12r. Further, the width W2 of the second lateral side portion 3q becomes broader than the width W1 of the first lateral side portion 3p. Further, the width W2 of the second lateral side portion 3q becomes broader than the width W3 of the outside portion 3r on the side opposite to the tooth portion 12s related to the bus part 12r. Note that, the width W3 of the outside portion 3r may be broader than, equal to, or narrower than the width W1 of the first lateral side portion 3p.

Note that, the shape of the transverse cross-section of the gap 3 may be the same or may be different among three or two of the first lateral side portion 3p, second lateral side portion 3q, and outside portion 3r. The specific values etc. of the widths W1 to W3 may be suitably set. For example, the width W2 is 1.1 times or more or 1.5 times or more of the width W1 or W3.

As described above, in the present embodiment as well, the electrostatic chuck 20 has the insulating base body 1 having the predetermined surface (see the upper surface 1a in FIG. 1A) and the layered electrodes 12 along the upper surface 1a in the base body 1. The upper surfaces 12a of the electrodes 12 and the base body 1 are in contact, and the gap 3 which is rendered a vacuum or filled with a gas is interposed between the side surfaces 12c of the electrodes 12 and the base body 1. Accordingly, the same effects as those by the first embodiment are exerted. For example, removal of the charge is made faster.

Further, in the present embodiment, each electrode 12, in a plane view of the upper surface 1a of the base body 1, has a connection portion (bus part 12r) and two extending portions (tooth portions 12s) which extend from the bus part 12r alongside each other. The gap 3 may have the first lateral side portion 3p contacting the side surface 12c of the tooth portion 12s and the second lateral side portion 3q which contacts the side surface 12c of the bus part 12r and is broader in the width W2 from the side surface 12c of the bus part 12r than the width W1 of the first lateral side portion 3p from the side surface 12c of the tooth portion 12s.

The connection portion of the plurality of tooth portions 12s and the bus part 12r is for example apt to be a specific point concerning removal of the charge since the ratio between volume of the base body 1 and the volume of the conductor is different compared with the majority of the plurality of tooth portions 12s. By making the width of the gap 3 relatively large at this specific point to promote removal of the charge, for example, when evaluating the speed of removal of the charge of the chuck 20, it becomes easier to exclude the specific point from consideration. As a result, for example, design is facilitated.

Further, in the present embodiment, the gap 3 may have the outside portion 3r in contact with the side surface 12c (outside side surface) of the connection portion (bus part 12r) on the side opposite to the extending portions (tooth portions 12s), and the inside portion (second lateral side portion 3q) which contacts the side surface 12c (inside side surface) of the bus part 12r positioned between the two tooth portions 12s and is larger in the width W2 from the inside side surface than the width W3 of the outside portion 3r from the outside side surface.

As in the embodiment, in the arc-shaped bus part 12r, the radius of curvature on the inside is smaller than the radius of curvature on the outside. For this reason, when the width of the gap 3 is the same between the inside and the outside, the volume of the gap 3 per unit length of the bus part 12r becomes smaller on the inside than the outside. Therefore, by making the width W2 of the gap 3 on the inside from the width W3 on the outside, the difference of the two can be reduced.

Third Embodiment

Figure 7A:
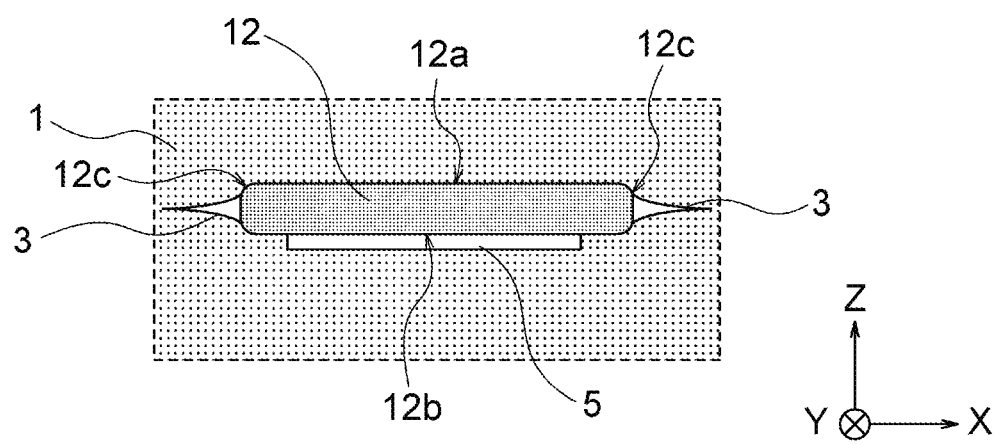
FIG. 7A is a cross-sectional view showing the principal parts in an electrostatic chuck according to a third embodiment.

FIG. 7A is a cross-sectional view showing the principal parts of an electrostatic chuck according to a third embodiment and corresponds to FIG. 2C.

The electrostatic chuck according to the third embodiment differs from the first and second embodiments only in the point that a gap 5 is formed between the lower surface 12b of each electrode 12 and the base body 1. The gap 5, in the same way as the gap 3 between the side surface 2c of the electrode 12 and the base body 1, is a space rendered a vacuum or filled with a gas.

Note that, in FIG. 7A, as the electrode, the electrode 12 in the second embodiment (in more detail, for example, a transverse cross-section perpendicular to the long direction of the bus part 12r or the tooth portion 12s) is illustrated. However, the electrode may be the electrode 2 in the first embodiment as well. In the following explanation, sometimes only the notation of the electrode 12 will be assigned, however, this may also be suitably replaced with the notation of the electrode 2. The same is true for a fourth embodiment (FIG. 7B) which will be explained later.

Further, in FIG. 7A, as the shape of the transverse cross-section of the gap 3, the one illustrated in FIG. 4A is shown. However, the shape of the transverse cross-section of the gap 3 is not limited to this. For example, the other specific example illustrated in the first embodiment may be combined with the present embodiment. Further, in FIG. 7A, as the shape of the transverse cross-section of the electrode 12, a shape of a rectangle where the corner portions are chamfered is illustrated. However, the shape of the transverse cross-section of the electrode 12 is not limited to this. For example, various specific examples illustrated in the first embodiment may be combined with the present embodiment as well.

As already explained, the shape and size of the transverse cross-section of the gap 3 is for example substantially constant over the entirety of the outer edge of the electrode 12. Also the gap 5 basically may continuously extend over the entirety of the long direction of the outer edge of the electrode 12. For example, in the second embodiment, the gap 5 may extend in the direction of extension of the bus part 12r and/or tooth portion 12s. In the first embodiment, the gap 5 may extend along the straight portion and/or arc-shaped portion of the outer edge of the electrode 2. However, there may be an interrupted portion in the middle as well. The length of the gap 5 in the portion continuously extending along the outer edge of the electrode 12 is for example longer than the width of the gap 5 or longer than 10 times the width.

The shape and size etc. of the transverse cross-section of the gap 5 may be suitably set. In the example shown, the gap 5 extends in a direction (for example the width direction of the bus part 12r or tooth portion 12s) perpendicular to the outer edge of the electrode 12 with substantially a constant height (Z-axis direction). The height of the gap 5 is for example ½ or less of the thickness of the electrode 12 and/or 30 μm or less or 10 μm or less. Further, the height of the gap 5 is 1 μm or more and/or 1% or more of the thickness of the electrode 12. The width of the gap 5 in the direction perpendicular to the outer edge of the electrode 12 is for example ½ or more and less than 1 time of the width of the electrode 12 in the intersecting direction. Note that, in the example shown, the gap 5 extends over the entirety in the width direction without interruption. However, due to manufacturing error or intent, there may be a portion where the gap 5 is interrupted as well. Further, the gap 5, for example, is positioned on the center side thereof with respect to the width of the electrode 12. However, it may be positioned closer to one side of the width direction with respect to the electrode 12 as well.

The gap 3 and the gap 5 are for example basically cut off from each other. However, in a portion in the direction along the outer edge of the electrode 12 (deep direction in the drawing sheet), there may also be a transverse cross-section where the gap 3 and the gap 5 are communicated with each other. For example, the gap 3 and the gap 5 are cut off from each other over 80% or more of the length of the gap 5 along the outer edge of the electrode 12. In a case where the lower surface 3b of the gap 3 is positioned lower than the lower surface 12b of the electrode 12 as in the examples in FIG. 12, the lower surface 3b may be positioned in an upper part, may be flush, or may be positioned in a lower part relative to the lower surface of the gap 5. This is true also in the fourth embodiment which will be explained later.

As described above, in the third embodiment, the electrostatic chuck has the base body 1 and electrodes 12. The base body 1 is made of an insulating material. Further, it has the upper surface 1a (see the first embodiment). The electrodes 12 are layer shapes running along the upper surface 1a in the base body 1. The upper surfaces 12a of the electrodes 12 and the base body 1 are in contact, and the gap 5 which is rendered a vacuum or filled with a gas is interposed between the lower surfaces 12b of the electrodes 12 and the base body 1.

Accordingly, for example, the electrodes 12 easily direct the charges to the upper side portion of the base body 1 than the lower side portion of the base body 1. As a result, for example, the clamping force can be efficiently made larger. Further, from another viewpoint, the charges which do not contribute to clamping or have a low degree of contribution to clamping and must be removed in the lower side portion of the base body 1 is reduced.

Fourth Embodiment

Figure 7B:
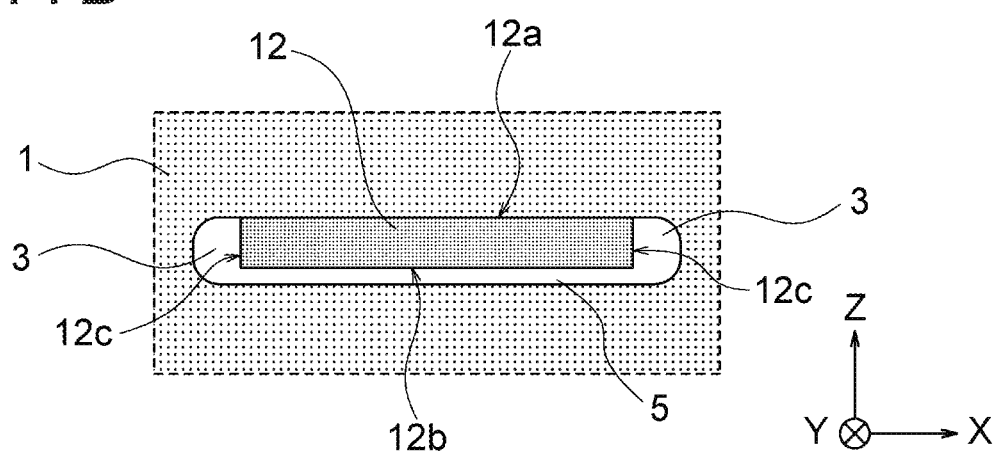
FIG. 7B is a cross-sectional view showing the principal parts in an electrostatic chuck according to a fourth embodiment.

FIG. 7B is a cross-sectional view showing the principal parts of an electrostatic chuck according to the fourth embodiment and is the same view as FIG. 7A.

The fourth embodiment differs from the third embodiment only in the point that the gap 3 between the side surface 12c of each electrode 12 and the base body 1 and the gap 5 between the lower surface 2b of the electrode 12 and the base body 1 are communicated.

In FIG. 7B, as the shape of the transverse cross-section of the gap 3, a substantially semicircular-shaped one is illustrated. That is, the inner surface of the gap 3 is formed in a curved surface shape so that the electrode 12 side is recessed. Further, as the shape of the transverse cross-section of the electrode 12, a rectangular one is illustrated. However, in the same way as the third embodiment, the shapes of the transverse cross-sections of the gap 3 and electrode 12 are not limited to these. For example, various specific examples illustrated in the first embodiment may be combined with the present embodiment.

The sizes etc. of the transverse cross-sections of the gap 3 and gap 5 may be suitably set in the same way as the first and third embodiments. However, they are set so that the gap 3 and the gap 5 are communicated. For example, in the gap 3, the height on the side surface 12c side of the electrode 12 (Z-axis direction) becomes more than the thickness of the electrode 12 (the gap 3 is similar to the examples in FIG. 12) and/or the portion on the electrode 12 side becomes closer to the lower part. Further, in the gap 5, the width on the lower surface 12b side of the electrode 12 becomes more than the width of the electrode 12.

Note that, the boundary between the gap 3 and the gap 5 need not be clear either. Further, in the example shown, the gap 5 is communicated with the two of the gaps 3 on the two sides. However, it may be communicated with only one as well. In this case, the gap 5 may be closer to the communicated gap 3 side relative to the electrode 12 as well.

In the above fourth embodiment as well, the same effects as those by the third embodiment are exerted. For example, the electrode 12 more easily directs the charge to the upper side portion of the base body 1 more than the lower side portion of the base body 1, therefore the clamping force can be efficiently made larger. By communication of the gap 5 and the gap 3, for example, the volume of the base body 1 in the portion which is positioned lower relative to the electrode 12 can be further reduced to improve the above effects. Note that, in the third embodiment, compared with the fourth embodiment, for example, it is easy to secure the strength of the electrostatic chuck since the portion where the gap 3 and the gap 5 are cut off contributes to support of the electrode 12 with respect to the base body 1.

<Method for Manufacturing Electrostatic Chuck>

Figure 8:
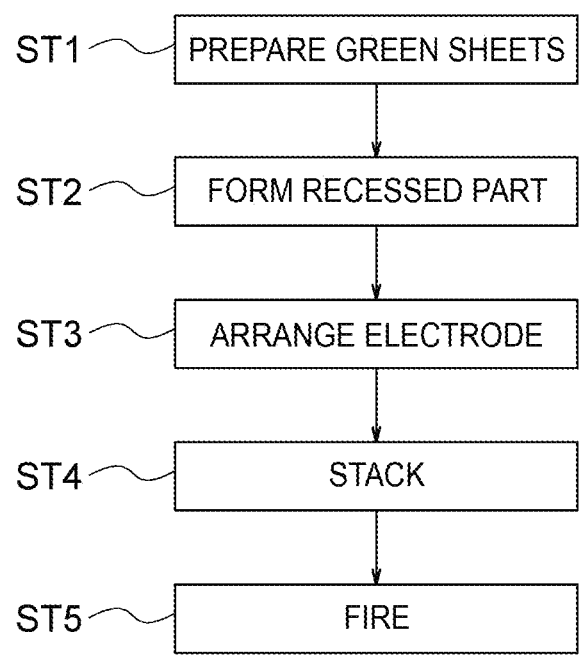
FIG. 8 is a flow chart showing an example of an outline of a procedure of a method for manufacturing the electrostatic chuck according to the embodiments.

FIG. 8 is a flow chart showing an example of an outline of the procedure in a method for manufacturing the chucks 10 and 20. FIG. 9A to FIG. 9D are schematic cross-sectional views supplementing the flow chart and correspond to the IX-IX line in FIG. 5. Note that, in these views, in the pair of electrodes 12, only 10 tooth portions 12s are shown. FIG. 10A is an enlarged view of a region Xa in FIG. 9C. FIG. 10B and FIG. 10C are enlarged views of a region Xb in FIG. 9D.

Note that, here, presence of the resistance heating element 9 and terminals 4 etc. is ignored. However, in a case where the resistance heating element 9 is provided, the number of ceramic green sheets which will be explained later etc. only have to be increased. Further, in the views, the electrode 12 is taken as the example. The same is true for the case of the electrode 2. In the following explanation, along with progress of the manufacturing steps, even if the characteristics and shapes of the members change, sometimes use will be made of the same notations before and after the change.

Figure 9A:
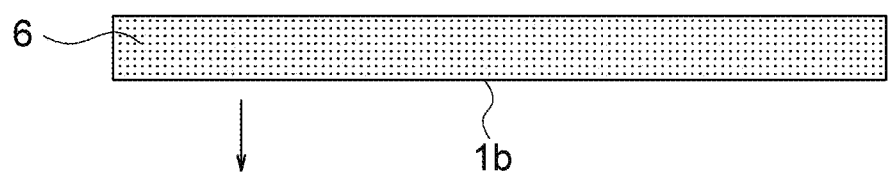
FIG. 9A, FIG. 9B, FIG. 9C, and FIG. 9D are schematic cross-sectional views for supplementing the flow chart in FIG. 8.

At step ST1, as shown in FIG. 9A (and FIG. 9C), ceramic green sheets 6 and 7 forming the base body 1 are prepared. As understood from the notations of the upper surface 1a and lower surface 1b, the ceramic green sheet 6 is the sheet configuring the lower surface 1b side portion in the base body 1, and the ceramic green sheet 7 is the sheet configuring the upper surface 1a side portion in the base body 1. However, the relationships of the ceramic green sheets 6 and 7 and the upper surface 1a and the lower surface 1b may be inverse to those described above. The method for manufacturing the ceramic green sheets may be the same as various known methods.

Figure 9B:
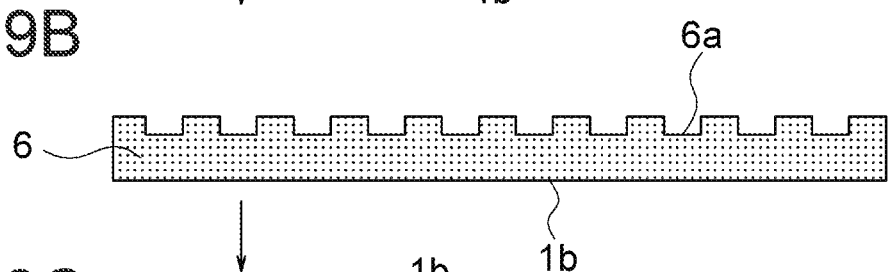

At step ST2, as shown in FIG. 9B, a recessed part 6a is formed in the ceramic green sheet 6. The recessed part 6a is a portion which accommodates the electrodes 12 in the base body 1 and partially becomes the gap 3 (and gap 5). When viewed on a plane, the recessed part 6a is formed with substantially the same planar shape as the planar shapes of the electrodes 12. The method of formation of the recessed part 6a may be a suitable one. For example, use may be made of a blast method of blasting abrasive grains to the ceramic green sheet 6 to shave the ceramic green sheet 6.

Figure 9C:
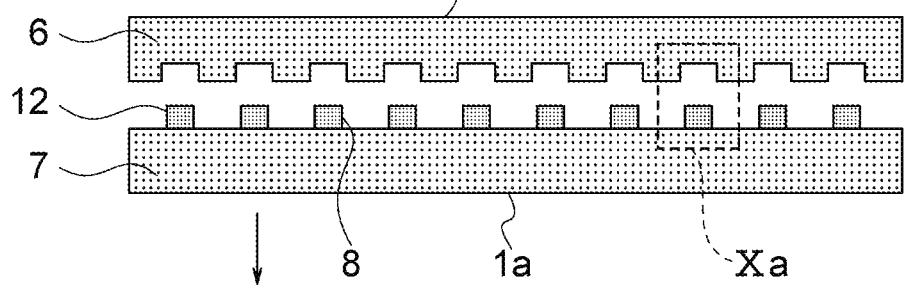
Figure 10A:
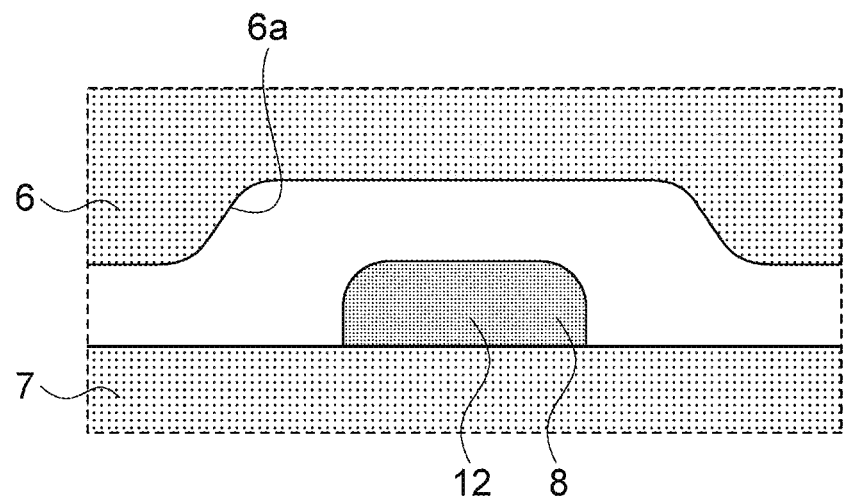
FIG. 10A is an enlarged view of a region Xa in FIG. 9C, and FIG. 10B and FIG. 10C are enlarged views of a region Xb in FIG. 9D.
Figure 10B:
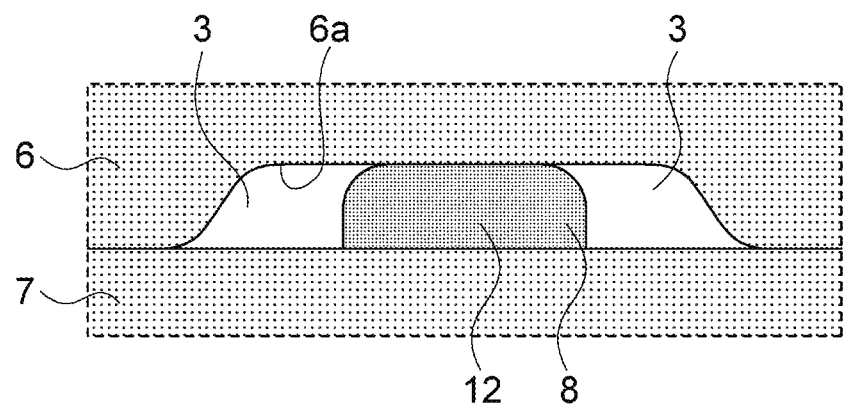
Figure 10C:
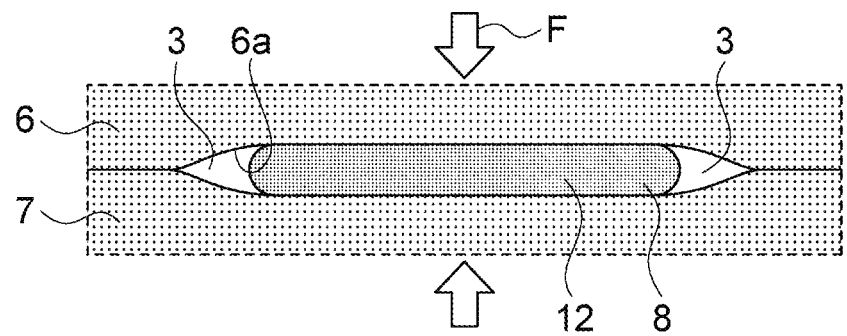

At step ST3, as shown in FIG. 9C and FIG. 10A, a conductive material 8 (for example conductive paste) forming the electrodes 12 is placed on the ceramic green sheet 7. The conductive material 8, when viewed on a plane, is arranged with the same patterns as the patterns of the electrodes 12. The method of arrangement of the conductive material 8 may be various known ones. For example, use may be made of screen printing. Note that, although not particularly shown, it is also possible to arrange the conductive material 8 not on the ceramic green sheet 7, but in the recessed part 6a in the ceramic green sheet 6.

Figure 9D:
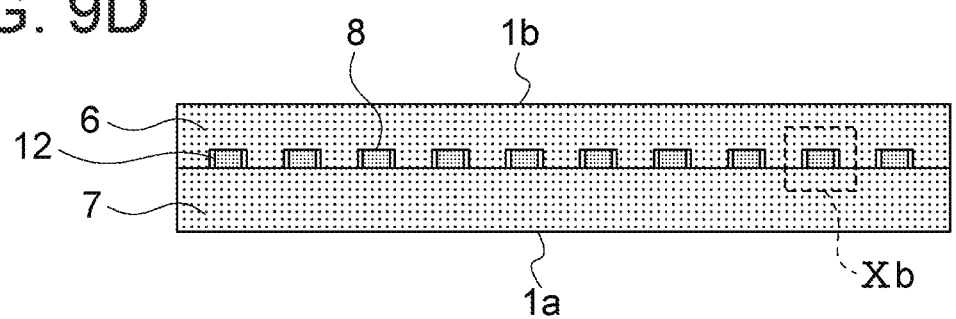

At step ST4, as shown in FIG. 9D and FIG. 10B, the ceramic green sheets 6 and 7 are joined with each other. At this time, the conductive material 8 is accommodated in the recessed part 6a. The planar shape of the recessed part 6a is larger than the planar shapes of the conductive material 8, therefore a space forming the gap 3 is formed on the periphery of the conductive material 8. In joining the sheets, as shown in FIG. 10C, a compression force F may be applied in the thickness direction as well. Due to this, the recessed part 6a and conductive material 8 may be crushed and deformed as well.

At step ST 5, the ceramic green sheets 6 and 7 are fired. Due to this, the base body 1 in which the electrodes 12 (2) are buried is prepared. That is, the chuck 20 (10) is prepared.

In the above manufacturing method, by suitably adjusting the shapes and dimensions of the recessed part 6a and conductive material 8, the atmosphere on the periphery of the ceramic green sheets, the pressure to be given to the ceramic green sheets, and various other conditions, various specific examples according to the shape of the transverse cross-section of the gap 3 are realized.

For example, at the time of joining the ceramic green sheets to each other, a portion in the recessed part 6a which forms the gap 3 may be crushed and/or a portion in the ceramic green sheet which is superimposed on the conductive material 8 may be made recessed, thereby a gap 3 thinner than the thickness of the electrode 2 as shown in FIG. 3B to FIG. 4C may be formed. So as to cause such deformation, for example, the recessed part 6a may be made shallower relative to the thickness of the conductive material 8, the compression force F may be made relatively large, the ceramic green sheets may be made relatively soft, the viscosity of the conductive material 8 may be made relatively high, and/or the ceramic green sheets may be joined to each other in a reduced pressure atmosphere (the gap 3 may be reduced in pressure).

Further, for example, in the recessed part 6a, a gap 3 thicker than the thickness of the electrode 2 as shown in FIG. 12 may be formed by forming a portion deeper than the center side on the outer circumferential side and/or forming a recessed groove at the position in the ceramic green sheet 7 which faces the outer circumferential side portion of the recessed part 6a.

Further, for example, the shapes shown in FIG. 2C, FIG. 3A, and FIG. 3B may be realized by making the shape of the transverse cross-section of the recessed part 6a closer to a rectangle.

Further, for example, as understood from FIG. 10A to FIG. 10C, a shape where the height becomes smaller the further separated from the electrode 2 in all or part of the gap 3 as shown in FIG. 3C to FIG. 4A may be realized by forming the recessed part 6a so as to become broader (increase the diameter) toward the opening side. Note that, this recessed part 6a increasing in diameter toward the opening side can be formed by the blast method.

Further, for example, the first height portion 3e shown in FIG. 4B may be formed by the amount of contraction of the electrode 2 being relatively large compared with the amount of contraction of the base body 1 after firing and separation of the side surface 2c of the electrode 2 from the base body 1 toward the center side in the width direction.

Further, for example, at the time of joining the ceramic green sheets to each other, the recessed part may be made by the conductive material 8 being pressed against the ceramic green sheet 7, thereby the gap 3 may be positioned at the center side in the thickness of the electrode 2. Further, by making one of the ceramic green sheets 6 and 7 relatively softer, the gap 3 may be formed closer to the side closer to the one as well.

Further, for example, the relatively broad second lateral side portion 3q shown in FIG. 6 may be realized by making the width of the recessed part 6a broader toward the inside of the bus part 12r in the portion corresponding to the bus part 12r. Note that, although not particularly shown, by making the position of the recessed part 6a closer to one side of the direction along the plane of the conductive material 8, the gap 3 may be formed on only one side of the direction along the electrode 2 or the width of the gap 3 on one side may be made broader than the width of the gap 3 on the other side.

Further, for example, the gap 5 may be formed by making the depth of the recessed part 6a larger than the thickness of the conductive material 8. Otherwise, the gap 5 may be formed by the amount of contraction of the electrode 2 being relatively large compared with the amount of contraction of the base body 1 after firing so that the lower surface 2b of the electrode 2 is separated from the base body 1. A chemical agent may be coated on the surface of the ceramic green sheet 6 and/or 7 so that the lower surface 2b is separated with a higher priority than the upper surface 2a. Further, for example, if irregularities are formed on the bottom surface of the recessed part 6a so that the projecting part abuts against the conductive material 8 and the recessed portion is separated from the conductive material, the gap 5 cut off from the gap 3 as shown in FIG. 7A can be formed.

Further, for example, at the time of joining the ceramic green sheets to each other, by suitably selecting the method of placement of the conductive material 8 or crushing the conductive material 8, the curved surface (projecting surface) shaped side surface 2c as shown in FIG. 3A, FIG. 3B, and FIG. 4A to FIG. 4C may be realized in the electrode 2. Further, by the crushed conductive material 8 protruding into the gap 3, the electrode 2 having the projecting part 2d as shown in FIG. 3C may be realized. Further, for example, the electrode 2 having the recessed part 2e as shown in FIG. 3D may be realized by the amount of contraction of the electrode 2 being relatively large compared with the amount of contraction of the base body 1 after firing to cause sinking in the portion which does not contact the base body 1. The electrode 2 having the recessed part 2e such as shown in FIG. 3D may be realized by the air pressure in the gap 3 without reduction of the pressure in the atmosphere at the time of joining the ceramic green sheets or suppressing the reduction of pressure.

Figure 11A:
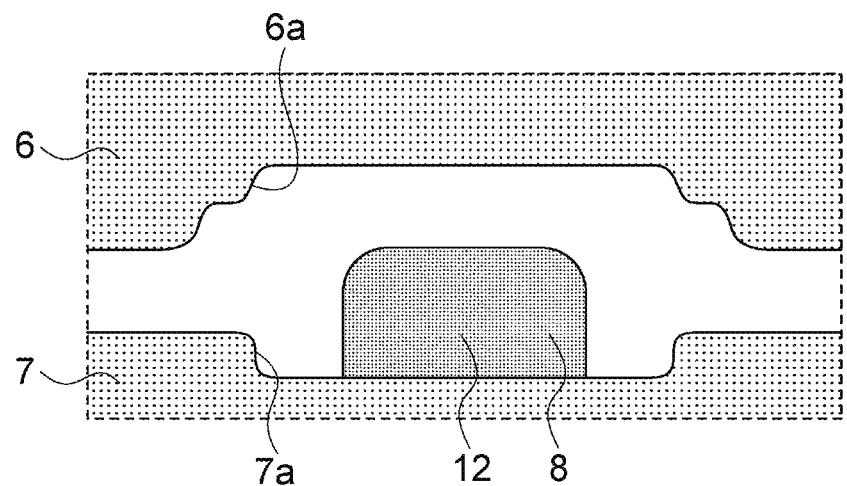
FIG. 11A, FIG. 11B, and FIG. 11C are views for explaining modifications of the method for manufacturing the electrostatic chuck.
Figure 11B:
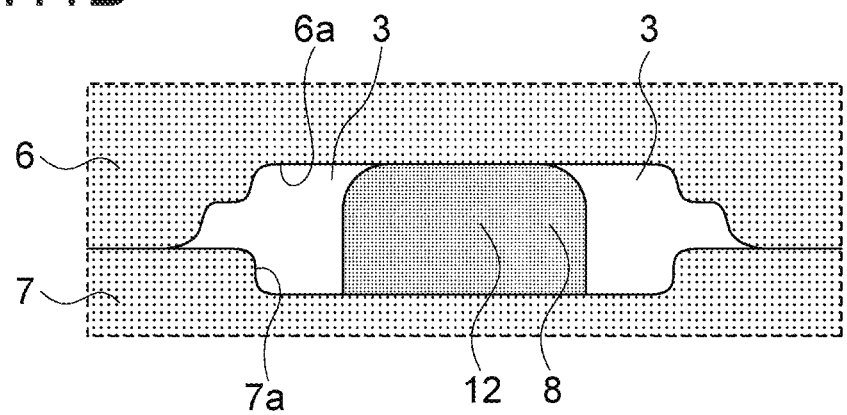

FIG. 11A is a view showing a modification of the method for manufacturing the electrostatic chuck and corresponds to FIG. 10A. Further, FIG. 11B is a view showing a continuation of FIG. 11A and corresponds to FIG. 10B.

As shown in these views, a recessed part 7a may be formed not only in the ceramic green sheet 6, but also in the ceramic green sheet 7, and/or the recessed part 6a (may be recessed part 7a as well) may have irregularities on the side surfaces. Further, as understood from FIG. 11B, due to the irregularities, the gap 3 having the first height portion 3e and second height portion 3f such as shown in FIG. 4B etc. may be realized as well. Further, the irregularities can be realized by using for example the blast method.

Figure 11C:
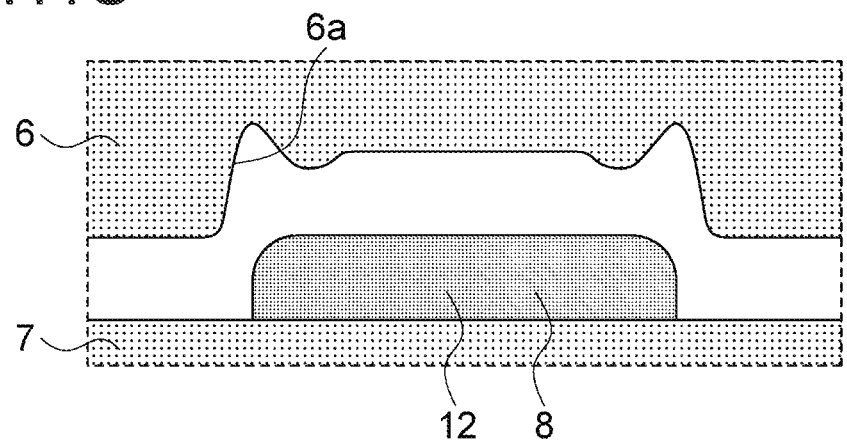

FIG. 11C is a view showing another modification of the method for manufacturing the electrostatic chuck and corresponds to FIG. 10A.

As already explained, irregularities may be formed on the bottom surface of the recessed part 6a. FIG. 11C shows one example of the irregularities on the bottom surface. In this example, the bottom surface of the recessed part 6a becomes deeper in the corner portions formed with the side surfaces of the recessed part 6a compared with the center side in the width direction of the bottom surface while becomes higher on the inside thereof. Such a recessed part 6a for example easily forms the gap 5 shown in FIG. 7A. Such a shape can be formed by the blast method.

Note that, the electrode 2 having the first position part 3m and second position part 3n such as shown in FIG. 4C may be realized by formation of the gap 3 by crushing the portion which becomes deeper near the side surface of the recessed part 6a in FIG. 11C.

The electrostatic chuck according to the present disclosure is not limited to the above embodiments and may be executed in various ways.

For example, the electrostatic chuck is not limited to a bipolar type having a pair of electrodes given potentials which are different from each other. It may be a monopolar type having only one electrode or a plurality of electrodes given the same potentials as each other. Further, the electrostatic chuck is not limited to one having only a one layer electrode. The electrostatic may have an electrode configured by two or more layers or may have two types of electrodes having different functions. For example, provision may be made of a main electrode layer generating a clamping force and an auxiliary electrode layer for promoting charging and/or discharging.

Also, the planar shapes of the electrodes may be various ones other than the illustrated shapes. For example, the monopolar type electrode may be solid pattern so as to extend substantially over the entire surface of the wafer, may be a spiral or meandering shape, or may be one having a straight portion extending in the radius direction and a plurality of arc-shaped portions extending alongside each other from the straight portion in the circumferential direction. The arc-shaped portions may be C-shaped or circular shaped.

Further, for example, the bipolar type electrode may be an electrode comprised of a solid pattern electrode extending over substantially the entire surface of the wafer not divided into two parts, but divided into three or more parts in the circumferential direction. Further, the bipolar type electrode may be an electrode comprised of two spiral-shaped electrodes provided coaxially and alternately positioned in the radius direction. The bipolar type electrode may be also be an electrode comprised of electrodes having straight portions and pluralities of C-shaped portions which extend alongside each other from the straight portions in the circumferential direction and having arc-shaped portions of the two electrodes intermeshing with each other (alternately arranged in the radius direction). Note that, this electrode may be grasped as a comb-shaped electrode as well. In place of the C-shaped portions extending over substantially 360°, an electrode having an arc-shaped portion less than 180° or less than 90° may be provided as well.

In the second embodiment, as the connection portions and extending portions, the bus parts 12r and tooth portions 12s in comb-shaped electrodes were illustrated. As understood from the illustration of the other aspects of the electrode described above, the connection portions and extending portions are not limited to the bus parts 12r and tooth portions 12s. For example, in a meandering shaped electrode, the portions which extend alongside each other may be defined as the two extending portions and their folded portions may be defined as the connection portions.

The method for manufacturing the electrostatic chuck is not limited to one firing stacked ceramic green sheets. It may also be one successively forming films of insulation layers as well. From another viewpoint, the insulation material configuring the base body is not limited to a ceramic.

In the third and fourth embodiments, combinations of the gap 3 between the side surface of the electrode and the base body and the gap 5 between the lower surface of the electrode and the base body were shown. However, only the gap 5 may be formed without the gap 3 being formed.

The configuration shown on the right side of the drawing sheet in FIG. 12 where the outer edge of the electrode 2 enters into the gap 3 positioned on the lateral side of the electrode 2 and where the side surface 2c of the electrode 2 abuts against the base body 1 may also extend over the entirety of the outer edge of the electrode 2. In this case, the portion in the gap 3 which is positioned lower than the electrode 2 may be grasped as the gap 5 in the third and fourth embodiments as well.

Further, from the example in FIG. 12, the technical idea of not requiring the gap 3 being interposed between the side surface 2c of the electrode 2 and the base body 1 can be extracted. For example, the electrostatic chuck may be configured so that the region on the center side in the upper surface of the electrode and the base body are in contact and a gap is interposed between the region on the outer edge side in the upper surface of the electrode (at least a portion thereof) and the base body.

REFERENCE SIGNS LIST

1 . . . base body, 1a . . . upper surface (predetermined surface), 2 . . . electrode, 2c . . . side surface, 3 . . . gap, and 101 . . . wafer.

The invention claimed is:

1. An electrostatic chuck comprising:
   an insulating base body comprising a predetermined surface; and
   an electrode inside the base body, the electrode being layer shaped along the predetermined surface, wherein
   an upper surface of the electrode and the base body are in contact, the upper surface facing a side where the predetermined surface is located, and
   a gap which is rendered a vacuum or filled with a gas is interposed between a side surface of the electrode and the base body, wherein the gap comprises a portion with a size in a direction perpendicular to the predetermined surface larger than a size of the electrode in the direction perpendicular to the predetermined surface.

2. The electrostatic chuck according to claim 1, wherein the gap, in a plan view of the predetermined surface, is continuous along the side surface of the electrode with a length larger than the width from the side surface of the electrode.

3. The electrostatic chuck according to claim 1, wherein one or more of the gaps are formed on two sides of the electrode in a direction along the predetermined surface.

4. The electrostatic chuck according to claim 1, wherein the gap comprises a portion with a size in a direction perpendicular to the predetermined surface smaller than a size of the electrode in the direction perpendicular to the predetermined surface.

5. The electrostatic chuck according to claim 1, wherein the gap comprises
   a first height portion and
   a second height portion which is located on a side opposite to the side surface of the electrode relative to the first height portion and is smaller in size in a direction perpendicular to the predetermined surface than that of the first height portion.

6. The electrostatic chuck according to claim 1, wherein the side surface of the electrode comprises a projecting surface.

7. The electrostatic chuck according to claim 1, wherein:
   the side surface of the electrode comprises a projecting part,
   a surface of the projecting part on the side where the predetermined surface is located is in contact with the base body, and
   the gap comprises a portion interposed between a surface of the projecting part on a side opposite to the predetermined surface and the base body.

8. The electrostatic chuck according to claim 1, wherein the side surface of the electrode comprises a recessed part.

9. The electrostatic chuck according to claim 1, further comprising
   another gap which is rendered a vacuum or filled with a gas is interposed between a lower surface of the electrode and the base body, the lower surface facing an opposite side to the predetermined surface.

10. An electrostatic chuck comprising:
    an insulating base body comprising a predetermined surface; and
    an electrode inside the base body, the electrode being layer shaped along the predetermined surface, wherein
    an upper surface of the electrode and the base body are in contact, the upper surface facing a side where the predetermined surface is located, and
    a gap which is rendered a vacuum or filled with a gas is interposed between a side surface of the electrode and the base body, wherein the gap comprises
    a first position part and
    a second position part which is located on a side opposite to the side surface of the electrode relative to the first position part and on a side opposite to the predetermined surface more than the first position part.

11. An electrostatic chuck comprising:
    an insulating base body comprising a predetermined surface; and
    an electrode inside the base body, the electrode being layer shaped along the predetermined surface, wherein
    an upper surface of the electrode and the base body are in contact, the upper surface facing a side where the predetermined surface is located, and
    a gap which is rendered a vacuum or filled with a gas is interposed between a side surface of the electrode and the base body, wherein:

the electrode, in a plan view of the predetermined surface, comprises
　a connection portion and
　two extending portions extending alongside each other from the connection portion, and
the gap comprises
　a first lateral side portion contacting a side surface of any of the extending portions and
　a second lateral side portion which is in contact with a side surface of the connection portion, a width of the second lateral side portion from the side surface of the connection portion being broader than a width of the first lateral side portion from the side surface of the extending portions.

12. An electrostatic chuck comprising:
an insulating base body comprising a predetermined surface; and
an electrode inside the base body, the electrode being layer shaped along the predetermined surface, wherein
an upper surface of the electrode and the base body are in contact, the upper surface facing a side where the predetermined surface is located, and
a gap which is rendered a vacuum or filled with a gas is interposed between a side surface of the electrode and the base body, wherein:
the electrode, in a plan view of the predetermined surface, comprises
　a connection portion and
　two extending portions extending alongside each other from the connection portion, and
the gap comprises
　an outside portion which is in contact with an outside side portion of the connection portion on the side opposite to the extending portions and
　an inner side portion which is in contact with an inside side surface of the connection portion located between the two extending portions, a width of the inner side portion from the inside side portion being larger than a width of the outside portion from the outside side surface.

13. An electrostatic chuck comprising:
an insulating base body comprising a predetermined surface; and
an electrode inside the base body, the electrode being layer shaped along the predetermined surface, wherein
an upper surface of the electrode and the base body are in contact, the upper surface facing a side where the predetermined surface is located, and
a gap which is rendered a vacuum or filled with a gas is interposed between a side surface of the electrode and the base body,
wherein between a lower surface of the electrode which faces an opposite side to the predetermined surface and the base body, another gap which is rendered a vacuum or filled with a gas is interposed.

14. An electrostatic chuck comprising:
an insulating base body comprising a predetermined surface; and
an electrode inside the base body, the electrode being layer shaped along the predetermined surface, wherein
an upper surface of the electrode and the base body are in contact, the upper surface facing a side where the predetermined surface is located, and
a gap which is rendered a vacuum or filled with a gas is interposed between a side surface of the electrode and the base body, the electrostatic chuck comprising two of the electrodes,
each of the electrodes comprises
　a connection portion and
　a plurality of extending portions extending alongside each other from the connection portion, and
the plurality of extending portions in one electrode and the plurality of extending portions in another electrode are alternately arranged in their width direction.

\* \* \* \* \*